(12) United States Patent
Park et al.

(10) Patent No.: US 12,131,784 B2
(45) Date of Patent: Oct. 29, 2024

(54) NON-VOLATILE MEMORY DEVICE

(71) Applicant: Samsung Electronics Co., Ltd., Suwon-si (KR)

(72) Inventors: Sangwon Park, Seoul (KR); Bongsoon Lim, Seoul (KR); Byungsoo Kim, Anyang-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 131 days.

(21) Appl. No.: 17/742,874

(22) Filed: May 12, 2022

(65) Prior Publication Data
US 2023/0116928 A1 Apr. 20, 2023

(30) Foreign Application Priority Data

Oct. 18, 2021 (KR) .................. 10-2021-0138801

(51) Int. Cl.
*G11C 16/00* (2006.01)
*G11C 5/06* (2006.01)
(Continued)

(52) U.S. Cl.
CPC ............. *G11C 16/16* (2013.01); *G11C 5/063* (2013.01); *G11C 16/08* (2013.01); *G11C 16/26* (2013.01); *G11C 16/30* (2013.01)

(58) Field of Classification Search
CPC ..... G11C 16/08; G11C 16/0483; G11C 16/16; G11C 16/26; G11C 16/30; G11C 16/24; G11C 16/32; G11C 16/3445; G11C 16/14; G11C 11/5635; G11C 16/0433; G11C 5/063; G11C 16/10; G11C 2029/1202; G11C 29/025; G11C 8/10; G11C 16/102; G11C 16/3459; G11C 2029/4402;
(Continued)

(56) References Cited

U.S. PATENT DOCUMENTS 7,679,133 B2  3/2010 Son et al.
8,553,466 B2  10/2013 Han et al.
(Continued)

FOREIGN PATENT DOCUMENTS

KR  2021/0087412 A  7/2021

OTHER PUBLICATIONS

Extended European Search Report dated Dec. 9, 2022, issued in corresponding European Patent Application No. 22177828.5.

*Primary Examiner* — Thong Q Le
(74) *Attorney, Agent, or Firm* — HARNESS, DICKEY & PIERCE, P.L.C.

(57) ABSTRACT

A non-volatile memory device includes a plurality of word lines stacked above a substrate in a vertical direction; erase control lines that are spaced apart from each other in a first direction and extend in a second direction; a pass transistor circuit including a first pass transistor connected to a first group of erase control lines and a second pass transistor connected to a second group of erase control lines; and a memory cell array including a plurality of blocks. The first group of erase control lines are relatively close to a word line cut region and the second group of erase control lines are relatively far from the word line cut region. Each of the plurality of blocks includes a plurality of channel structures connected to the word lines and the erase control lines and each channel structure extends in the vertical direction.

20 Claims, 25 Drawing Sheets

(51) Int. Cl.
  *G11C 16/08*      (2006.01)
  *G11C 16/16*      (2006.01)
  *G11C 16/26*      (2006.01)
  *G11C 16/30*      (2006.01)

(58) Field of Classification Search
  CPC ............ G11C 2029/5006; G11C 29/50; G11C 29/802; G11C 29/804; G11C 29/82; G11C 29/835; G11C 5/025; G11C 7/1057; G11C 8/08; G11C 8/14; G11C 16/34; G11C 16/3436; G11C 29/024; G11C 29/04; G11C 29/12005
  USPC .................................................... 365/185.29
  See application file for complete search history.

(56) References Cited

U.S. PATENT DOCUMENTS

| | | |
|---|---|---|
| 8,559,235 B2 | 10/2013 | Yoon et al. |
| 8,649,219 B2 | 2/2014 | Li et al. |
| 8,654,585 B2 | 2/2014 | Oh et al. |
| 8,654,587 B2 | 2/2014 | Yoon et al. |
| 8,902,658 B1 | 12/2014 | Raghu et al. |
| 9,047,973 B2 | 6/2015 | Costa et al. |
| 9,741,438 B2 | 8/2017 | Kwak et al. |
| 9,786,378 B1 | 10/2017 | Zhang et al. |
| 10,650,898 B1 | 5/2020 | Rabkin et al. |
| 10,741,253 B1 | 8/2020 | Lu et al. |
| 10,923,195 B2 | 2/2021 | Bae et al. |
| 11,056,193 B2 | 7/2021 | Yun et al. |
| 11,437,105 B2 * | 9/2022 | Lee .................... G11C 11/5635 |
| 2011/0233648 A1 | 9/2011 | Seol et al. |
| 2020/0312381 A1 | 10/2020 | Nam et al. |
| 2021/0082518 A1 | 3/2021 | Yun et al. |

* cited by examiner

NON-VOLATILE MEMORY DEVICE

CROSS-REFERENCE TO RELATED APPLICATION

This application is based on and claims priority under 35 U.S.C. § 119 to Korean Patent Application No. 10-2021-0138801, filed on Oct. 18, 2021 in the Korean Intellectual Property Office, the disclosure of which is incorporated by reference herein in its entirety.

BACKGROUND

Inventive concepts relate to a memory device, and more particularly, to a non-volatile memory device having a multi-hole structure.

A memory device is used in storing data and classified into a volatile memory device and a non-volatile memory device. According to the demand for high capacity and compactness of a non-volatile memory devices, a three-dimensional memory device including a plurality of channel holes, that is, a plurality of channel structures, extending on a substrate in a vertical direction, has been developed. To further increase the integration degree of three-dimensional memory devices, the number of channel holes included in each memory block, that is, the number of channel structures, may be even more increased. Non-volatile memory devices having a multi-hole structure may have varying performance due to a difference in the intrinsic characteristics of channel holes, that is, channel structures.

SUMMARY

Inventive concepts provide a non-volatile memory device, the variation in the performance of which due to the difference in the intrinsic characteristics of channel holes may be reduced by controlling an erase operation in consideration of the intrinsic characteristics of the channel holes.

According to an embodiment of inventive concepts, a non-volatile memory device may include a plurality of word lines stacked above a substrate in a vertical direction, the plurality of word lines including a word line cut region; a plurality of erase control lines spaced apart from each other in a first direction and extending in a second direction orthogonal to the first direction, wherein a first group of the plurality of erase control lines are relatively close to the word line cut region compared to a second group of the plurality of erase control lines that is relatively far from the word line cut region; a pass transistor circuit including a first pass transistor and a second pass transistor; and a memory cell array. The first pass transistor may be connected to the first group of the plurality of erase control lines and the second pass transistor may be connected to the second group of the plurality of erase control lines. The memory cell array may include a plurality of blocks. Each block among the plurality of blocks may include a plurality of channel structures connected to the plurality of word lines and the plurality of erase control lines, and each of the plurality of channel structures may extend in the vertical direction.

According to an embodiment of inventive concepts, a non-volatile memory device may include a memory cell array, a pass transistor circuit, and a control logic circuit. The memory cell array may include a plurality of memory cells and a plurality of erase control transistors. The memory cell array may include a plurality of word lines. The plurality of word lines may include a word line cut region. The plurality of erase control transistors may be respectively connected to a plurality of erase control lines arranged on a same level. The plurality of erase control lines may be grouped into a plurality of groups. The plurality of groups may include a first group of the plurality of erase control lines including erase control lines that are relatively close to the word line cut region and a second group of the plurality of erase control lines including erase control lines that are relatively far from the word line cut region. The pass transistor circuit may include a first pass transistor connected to the first group of the plurality of erase control lines and a second pass transistor connected to the second group of the plurality of erase control lines. In response to an erase command, the control logic circuit may be configured to differently control at least one of voltage levels and application times of a first erase control voltage applied to the first pass transistor and a second erase control voltage applied to the second pass transistor.

According to an embodiment of inventive concepts, a non-volatile memory device may include a plurality of word lines stacked above a substrate in a vertical direction, the plurality of word lines including a word line cut region; a plurality of string select lines above the plurality of word lines, the plurality of string select lines being spaced apart from each other in a first direction and extending in a second direction orthogonal to the first direction, respectively; a plurality of erase control lines respectively arranged above the plurality of string select lines, wherein the plurality of erase control lines may be grouped into a plurality of groups, the plurality of groups may include a first group of the plurality of erase control lines including erase control lines that are relatively close to a word line cut region and a second group of the plurality of erase control lines including erase control lines that are relatively far from the word line cut region; a pass transistor circuit including a first pass transistor connected to the first group of the plurality of erase control lines and a second pass transistor connected to the second group of the plurality of erase control lines; and a memory cell array including a plurality of memory cells connected to the plurality of word lines. The non-volatile memory device may be configured to apply a first erase control voltage to the first group of the plurality of erase control lines via the first pass transistor and apply a second erase control voltage to the second group of the plurality of erase control lines via the second pass transistor. A voltage level of the first erase control voltage may be different from a voltage level of the second erase control voltage.

BRIEF DESCRIPTION OF THE DRAWINGS

Embodiments of inventive concepts will be more clearly understood from the following detailed description taken in conjunction with the accompanying drawings in which.

DETAILED DESCRIPTION

Figure 1:
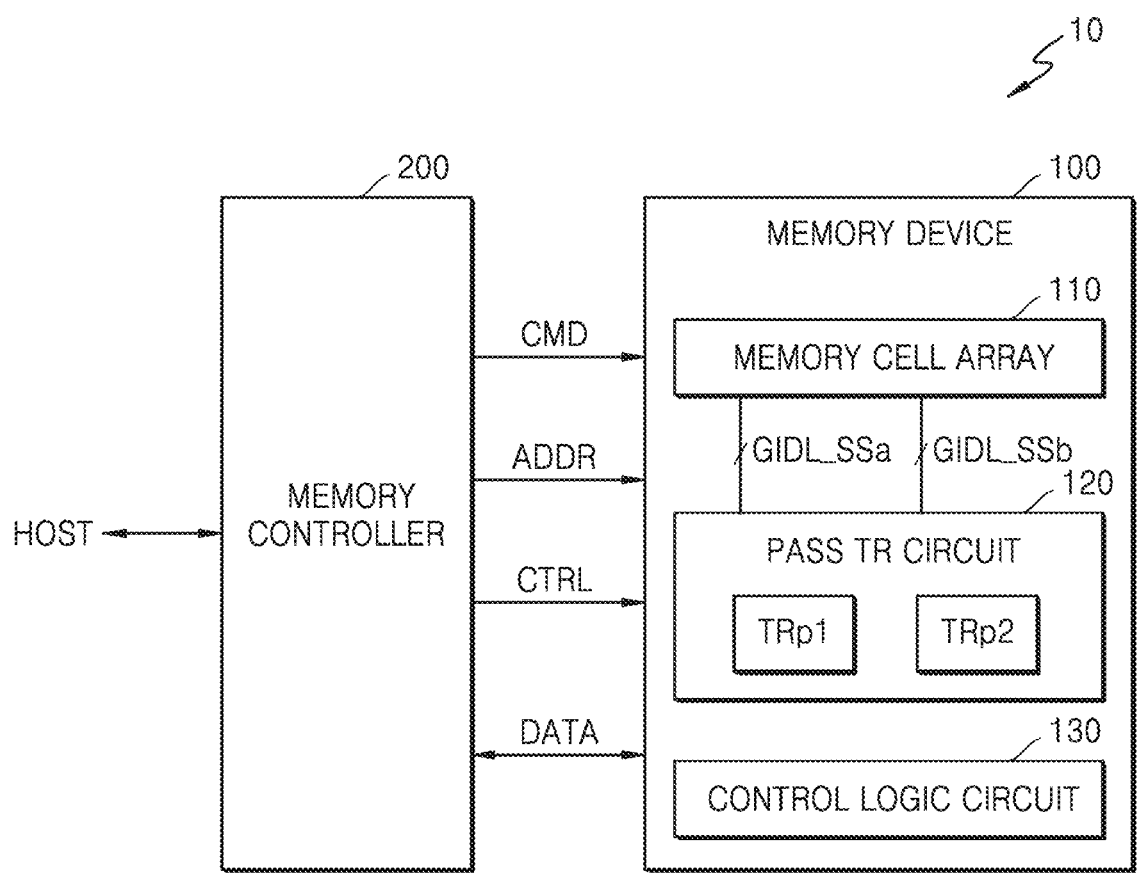
FIG. 1 is a block diagram illustrating a memory system according to an embodiment.

Hereinafter, embodiments of inventive concepts will be described in detail by referring to the attached drawings. The same reference numerals are used for the same components in the drawings, and repeated descriptions thereof are omitted.

FIG. 1 is a block diagram illustrating a memory system 10 according to an embodiment.

Referring to FIG. 1, the memory system 10 may include a memory device 100 and a memory controller 200, and the memory device 100 may include a memory cell array 110, a pass transistor circuit 120, and a control logic circuit 130. The memory device 100 may include a non-volatile memory device, and herein, a "memory device" refers to a "non-volatile memory device."

The memory controller 200 may control the memory device 100 to read data stored in the memory device 100 or program data into the memory device 100, in response to a read/write request from a host HOST. In detail, the memory controller 200 may control program, read, and erase operations on the memory device 100 by providing an address ADDR, a command CMD, and a control signal CTRL to the memory device 100. In addition, data DATA for programming and read data DATA may be transmitted or received between the memory controller 200 and the memory device 100.

The memory cell array 110 may include a plurality of memory cells, for example, flash memory cells. Hereinafter, embodiments of inventive concepts will be described with reference to a plurality of memory cells being NAND flash memory cells, as an example. However, inventive concepts are not limited thereto, and in some embodiments, the plurality of memory cells may include resistive memory cells such as resistive RAM (ReRAM) memory cells, phase change RAM (PRAM) memory cells, or magnetic RAM (MRAM) memory cells.

The memory cell array 110 may be connected to the pass transistor circuit 120 via a plurality of erase control lines GIDL_SSa and GIDL_SSb arranged at the same level. The plurality of erase control lines GIDL_SSa and GIDL_SSb may be grouped into a plurality of groups including a first group including the erase control lines GIDL_SSa that are relatively close to a word line cut region and a second group including the erase control lines GIDL_SSb that are relatively far from the word line cut region. In an embodiment, the plurality of erase control lines GIDL_SSa and GIDL_SSb may include a plurality of gate induced drain leakage (GIDL) gate lines.

The pass transistor circuit 120 may include a plurality of pass transistors including a first pass transistor TRp1 and a second pass transistor TRp2. The first pass transistor TRp1 may be commonly connected to the erase control lines GIDL_SSa of the first group to transmit a first erase control voltage to the erase control lines GIDL_SSa of the first group. The second pass transistor TRp2 may be commonly connected to the erase control lines GIDL_SSb of the second group to transmit a second erase control voltage to the erase control lines GIDL_SSb of the second group. For example, the erase control lines GIDL_SSa of the first group may be merged into a first erase control line (e.g., ECLa of FIGS. 7 to 9), and one end of the first pass transistor TRp1 may be connected to the first erase control line. For example, the erase control lines GIDL_SSb of the second group may be merged into a second erase control line (e.g., ECLb of FIGS. 7 to 9), and one end of the second pass transistor TRp2 may be connected to the second erase control line. Here, the first erase control line and the second erase control line may be separated from each other.

The control logic circuit 130 may receive a command CMD, an address ADDR, and a control signal CTRL from the memory controller 200, and may control the overall operation of the memory device 100 based on the received command CMD, the received address ADDR, and the received control signal CTRL. When the command CMD is an erase command, in response to the erase command, the control logic circuit 130 may differently control at least one of voltage levels and application times of a first erase control voltage applied to the first pass transistor TRp1 and a second erase control voltage applied to the second pass transistor TRp2.

In an embodiment, a voltage level of the first erase control voltage may be different from a voltage level of the second erase control voltage. In an embodiment, an application time of the first erase control voltage with respect to the first group may be different from an application time of the second erase control voltage with respect to the second group. For example, an application start time of the first erase control voltage with respect to the first group and an application start time of the second erase control voltage with respect to the second group may be different from each other. For example, an end point of application of the first erasing control voltage with respect to the first group may be different from an end point of application of the second erase control voltage with respect to the second group.

Also, the control logic circuit 130 may differently control compensation values with respect to at least one of the voltage levels and the application times of the first erase control voltage and the second erase control voltage. For example, the control logic circuit 130 may differently control compensation values with respect to at least one of the voltage levels and the application times of the first erase control voltage and the second erase control voltage, from each other, according to temperature, program/erase cycles, erase loops, and the like.

In an embodiment, a compensation value with respect to the voltage level of the first erase control voltage may be different from a compensation value with respect to the voltage level of the second erase control voltage. In an embodiment, a compensation value with respect to the application time of the first erase control voltage with respect to the first group may be different from a compensation value with respect to the application time of the second erase control voltage with respect to the second group. For example, a compensation value with respect to an application start time of the first erase control voltage with respect to the first group may be different from a compensation value with respect to an application start time of the second erase control voltage with respect to the second group. For example, a compensation value with respect to an application end time of the first erase control voltage with respect to the first group may be different from a compensation value with respect to an application end time of the second erase control voltage with respect to the second group.

As described above, according to the present embodiment, by differently controlling erase control lines included in different groups from each other, the variation in performance due to a difference in erase speeds according to the intrinsic characteristics of channel holes may be reduced. In detail, as erase control lines of the same group are merged, and erase control lines of different groups are separated, erase control lines included in a plurality of groups may be individually controlled, and thus, a GIDL current of each string may be improved and/or maximized, thereby improving the erase efficiency of a memory device despite the difference in the intrinsic characteristics of channel holes. In addition, instead of providing pass transistors respectively corresponding to the plurality of erase control lines, by providing pass transistors respectively corresponding to a plurality of groups, an increase in a chip size of a memory device may be reduced.

Figure 2:
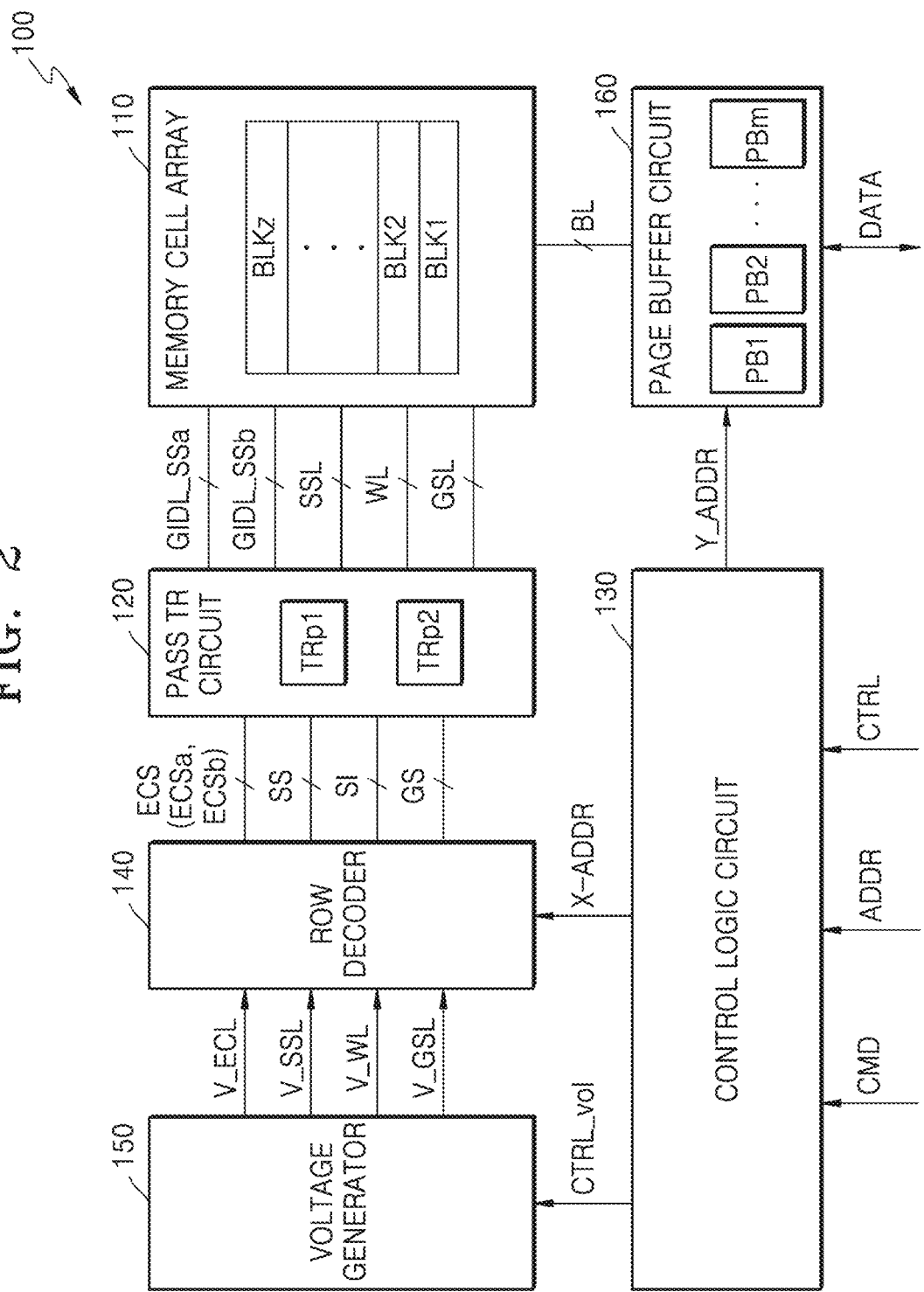
FIG. 2 is a block diagram illustrating a memory device according to an embodiment.

FIG. 2 is a block diagram illustrating the memory device 100 according to an embodiment.

Referring to FIG. 2, the memory device 100 may include the memory cell array 110, the pass transistor circuit 120, the control logic circuit 130, a row decoder 140, a voltage generator 150, and a page buffer circuit 160. Although not illustrated, the memory device 100 may further include an interface circuit, and the interface circuit may include a data input/output circuit, a command/address input/output circuit, and the like. Also, the memory device 100 may further include a temperature sensor.

The memory cell array 110 may include a plurality of memory blocks BLK1 to BLKz, where z is a positive integer. Each of the plurality of memory blocks BLK1 to BLKz may include a plurality of pages, and each of the plurality of pages may include a plurality of memory cells. For example, a memory block may be a unit of erasing, and a page may be a unit of writing and reading. Each memory cell may store one or more bits. In detail, each memory cell may be used as a single level cell (SLC), a multi-level cell (MLC), a triple level cell (TLC) or a quadruple level cell (QLC), or the like.

In addition, the memory cell array 110 may be connected to a plurality of word lines WL, a plurality of string select lines SSL, a plurality of ground select lines GSL, and the erase control lines GIDL_SSa of the first group, the erase control lines GIDL_SSb of the second group, and a plurality of bit lines BL. The memory cell array 110 may be connected to the pass transistor circuit 120 via the plurality of word lines WL, the plurality of string select lines SSL, the plurality of ground select lines GSL, the erase control lines GIDL_SSa of the first group, and the erase control lines GIDL_SSb of the second group, and may be connected to the page buffer circuit 160 via the plurality of bit lines BL. While FIG. 2 illustrates the erase control lines GIDL_SSa of the first group and the erase control lines GIDL_SSb of the second group, inventive concepts are not limited thereto, and the erase control lines may be grouped into a plurality of groups of three or more, and each group may include a plurality of erase control lines.

In an embodiment, the memory cell array 110 may include a three-dimensional memory cell array, and the three-dimensional memory cell array may include a plurality of NAND strings. Each NAND string may include memory cells respectively connected to word lines stacked vertically on a substrate. U.S. Pat. Nos. 7,679,133, 8,553,466, 8,654,587, 8,559,235, and U.S. Patent Application Publication No. 2011/0233648 are incorporated herein by reference in their entirety. However, in the event of any conflict or inconsistency between terms used herein and terms of the incorporated references, the terms used in this specification take precedence over the terms of the incorporated references.

The control logic circuit 130 may output various control signals for writing data to the memory cell array 110 or reading data from the memory cell array 110, based on the command CMD, the address ADDR, and the control signal CTRL, which are received from the memory controller 200. Accordingly, the control logic circuit 130 may generally control various operations in the memory device 100. In detail, the control logic circuit 130 may provide a voltage control signal CTRL_vol to the voltage generator 150, a row address X-ADDR to the row decoder 140, and a column address Y-ADDR to the page buffer circuit 160. However, inventive concepts are not limited thereto, and the control logic circuit 130 may further provide other control signals to the voltage generator 150, the row decoder 140, and the page buffer circuit 160.

The voltage generator 150 may generate various types of voltages for performing program, read, and erase operations based on the voltage control signal CTRL_vol). In detail, the voltage generator 150 may generate an erase control line voltage V_ECL, a word line voltage V_WL, a string select line voltage V_SSL, and a ground select line voltage V_GSL, and provide the generated erase control line voltage V_ECL, the generated word line voltage V_WL, the generated string select line voltage V_SSL, and the generated ground select line voltage V_GSL to the row decoder 140.

For example, the voltage generator 150 may generate a plurality of erase control voltages including a first erase control voltage and a second erase control voltage as the erase control line voltage V_ECL. For example, the voltage generator 150 may generate a program voltage, a read voltage, a program verify voltage, an erase voltage, or the like, as the word line voltage V_WL. For example, the voltage generator 150 may generate a selection voltage and a non-selection voltage as the string select line voltage V_SSL. For example, the voltage generator 150 may generate a selection voltage and a non-selection voltage as the ground select line voltage V_GSL. Also, the voltage generator 150 may further generate a bit line voltage (e.g., V_BL of FIGS. 14 to 16) and a common source line voltage (e.g., V_CSL of FIGS. 14 to 16).

During an erase operation, the row decoder 140 may provide, in response to the row address X_ADDR, an erase voltage to pass transistors (e.g., TR1 to TRn of FIG. 7) included in the pass transistor circuit 120 via plurality of word line driving signal lines SS. Also, during an erase operation, the row decoder 140 may provide erase control voltages to pass transistors included in the pass transistor circuit 120 via a plurality of erase control line driving signal lines ECS. For example, the row decoder 140 may provide the first erase control voltage to the first pass transistor TRp1 via a first erase control line driving signal line ECSa, and the second erase control voltage to the second pass transistor TRp2 via a second erase control line driving signal line ECSb. Furthermore, during an erase operation, the row decoder 140 may provide a bias voltage to the pass transistors (e.g., TRs and TRg of FIG. 7) included in the pass transistor circuit 120 via the string select line driving signal lines SS and ground select line driving signal lines GS.

The page buffer circuit 160 may select at least one bit line from among the plurality of bit lines BL in response to a column address Y_ADDR. The page buffer circuit 160 may operate as a write driver or a sense amplifier according to an operation mode. The page buffer circuit 160 may include a plurality of page buffers PB1 to PBm, where m is a positive integer. For example, m may correspond to the number of bit lines BL, and the plurality of page buffers PB1 to PBm may be respectively connected to the plurality of bit lines BL. For example, the plurality of bit lines BL may be grouped into a plurality of bit line groups, and bit lines included in each of the plurality of bit line groups may share a page buffer.

Figure 3:
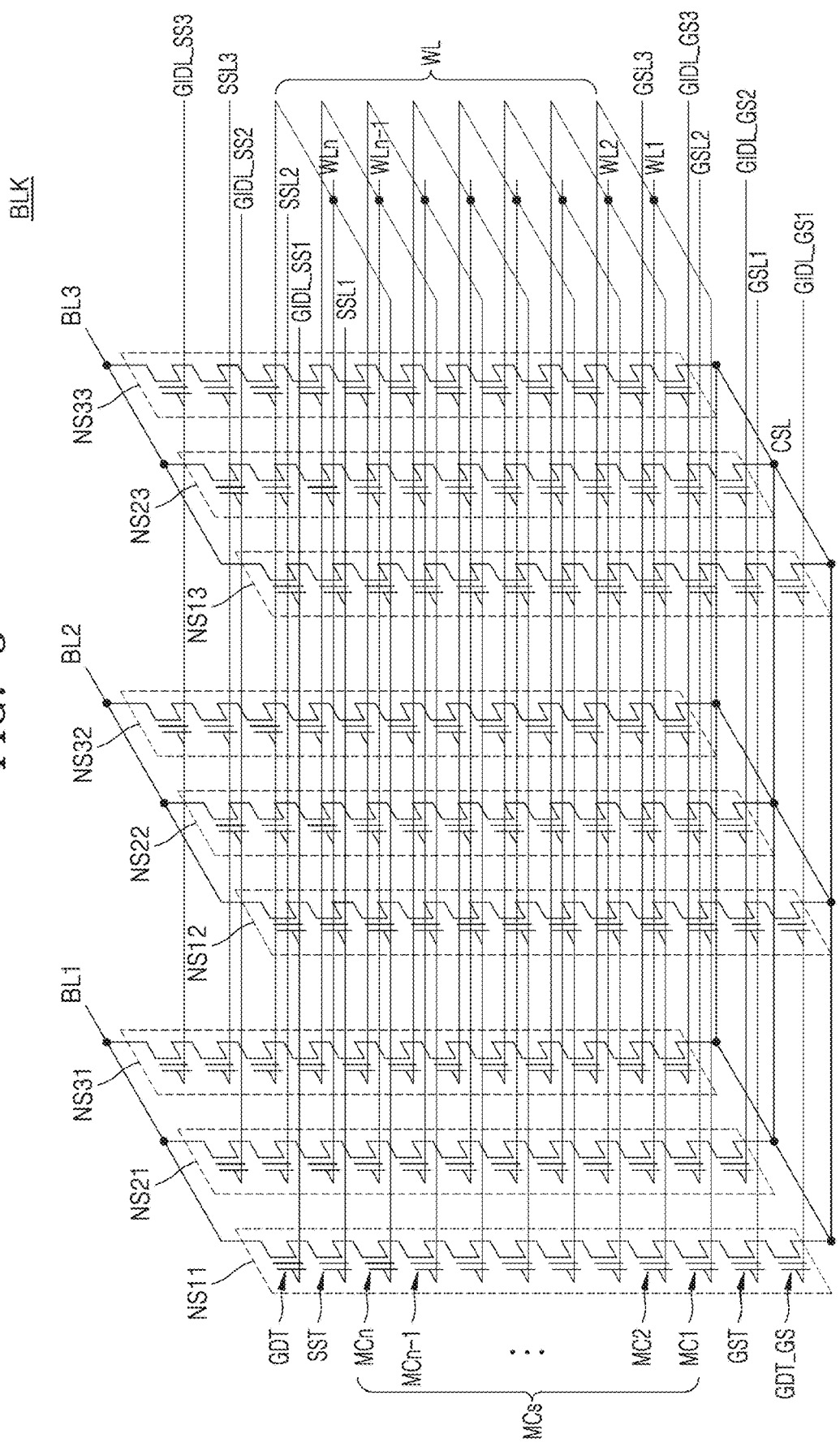
FIGS. 3 to 5 are circuit diagrams respectively illustrating memory blocks according to some embodiments.

FIG. 3 is a circuit diagram illustrating a memory block BLK according to an embodiment.

Referring to FIG. 3, the memory block BLK may correspond to one of the plurality of memory blocks BLK1 to BLKz of FIG. 2. The memory block BLK may include NAND strings NS11 to NS33 that may be connected to first to third bit lines BL1 to BL3, first to third erase control lines GIDL_SS1 to GIDL_SS3, first to third string select lines SSL1 to SSL3, the word lines WL, ground select lines GSL1 to GSL3, and erase control lines GIDL_GS1 to GIDL_GS3 and extend in a vertical direction VD, respectively. Here, the number of NAND strings, the number of word lines, the number of bit lines, the number of ground select lines, the number of string select lines, and the number of erase control lines may be variously changed according to embodiments.

The first to third bit lines BL1 to BL3 may extend in a first direction or a first horizontal direction HD1, and word lines WL1 to WLn may extend in a second direction or a second horizontal direction HD2, where n is a positive integer. The NAND strings NS11, NS21, and NS31 may be positioned between the first bit line BL1 and a common source line CSL, and the NAND strings NS12, NS22, and NS32 may be positioned between the second bit line BL2 and the common source line CSL, and the NAND strings N13, NS23, and NS33 may be positioned between the third bit line BL3 and the common source line CSL.

For example, the NAND string NS11 may include an erase control transistor GDT, a string select transistor SST, a plurality of memory cells MCs, a ground select transistor GST, and an erase control transistor GDT_GS that are connected in series. The erase control transistor GDT may be connected to the corresponding first bit line BL1 and the corresponding first erase control line GIDL_SS1. The string select transistor SST may be connected to the corresponding string select line SSL1, and the memory cells MCs may be respectively connected to the corresponding word lines WL1 to WLn.

The ground select transistor GST may be connected to the corresponding ground select line GSL1. The erase control transistor GDT_GS may be connected to the corresponding erase control line GIDL_GS1 and the common source line CSL. Hereinafter, the erase control lines GIDL_GS1 to GIDL_GS3 arranged below the ground select lines GSL1 to GSL3 are referred to as "ground erase control lines", and the erase control transistor GDT_GS is referred to as a "ground erase control transistor."

Figure 4:
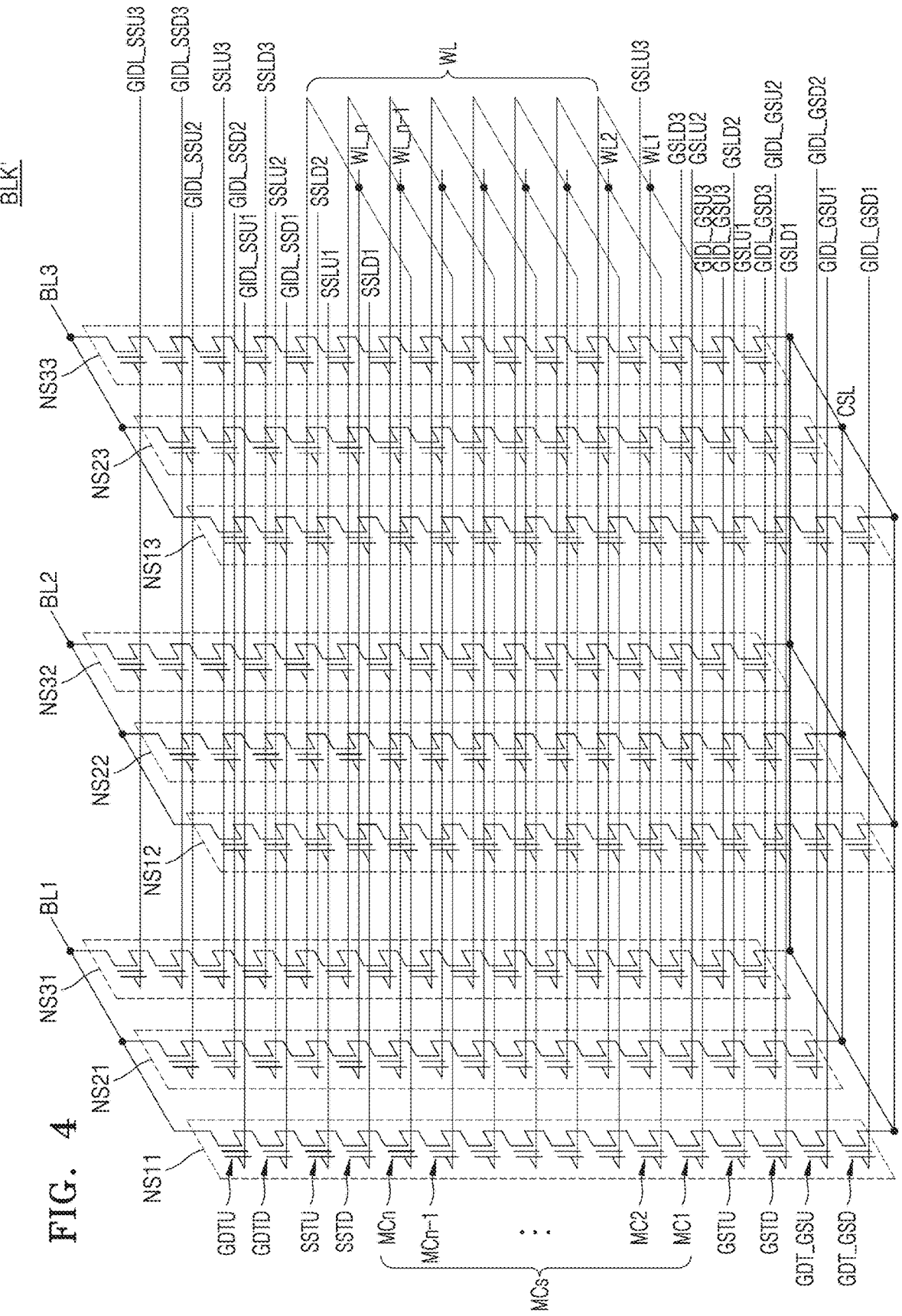

FIG. 4 is a circuit diagram illustrating a memory block BLK' according to an embodiment.

Referring to FIG. 4, the memory block BLK' may correspond to one of the plurality of memory blocks BLK1 to BLKz of FIG. 2. The memory block BLK' corresponds to a modified example of the memory block BLK of FIG. 3, and hereinafter, description will focus on differences from the memory block BLK of FIG. 3. The memory block BLK' may include the NAND strings NS11 to NS33 that may be connected to the first to third bit lines BL1 to BL3, upper erase control lines GIDL_SSU1 to GIDL_SSU3, lower erase control lines GIDL_SSD1 to GIDL_SSD3, upper string select lines SSLU1 to SSLU3, lower string select lines SSLD1 to SSLD3, the word lines WL, upper ground select lines GSLU1 to GSLU3, lower ground select lines GSLD1 to GSLD3, upper ground erase control lines GIDL_GSU1 to GIDL_GSU3, and lower ground erase control lines GIDL_GSD1 to GIDL_GSD3, and extend in the vertical direction VD, respectively.

For example, the NAND string NS11 may include an upper erase control transistor GDTU, a lower erase control transistor GDTD, an upper string select transistor SSTU, a lower string select transistor SSTD, and a plurality of memory cells MCs, an upper ground select transistor GSTU, a lower ground select transistor GSTD, an upper ground erase control transistor GDT_GSU, and a lower ground erase control transistor GDT_GSD, which are connected in series. The upper erase control transistor GDTU may be connected to the corresponding bit line BL1 and the corresponding erase control line GIDL_SSU1, and the lower erase control transistor GDTU may be connected to the corresponding erase control line GIDL_SSD1.

The upper string select transistor SSTU may be connected to the corresponding upper string select line SSLU1, and the lower string select transistor SSTD may be connected to the corresponding lower string select line SSLD1. The upper ground select transistor GSTU may be connected to the corresponding upper ground select line GSLU1, and the lower ground select transistor GSTD may be connected to the corresponding lower ground select line GSLD1. The upper ground erase control transistor GDT_GSU may be connected to the corresponding upper erase control line GIDL_GSU1, and the lower ground erase control transistor GDT_GSD may be connected to the corresponding lower erase control line GIDL_GSD1 and the common source line CSL.

Figure 5:
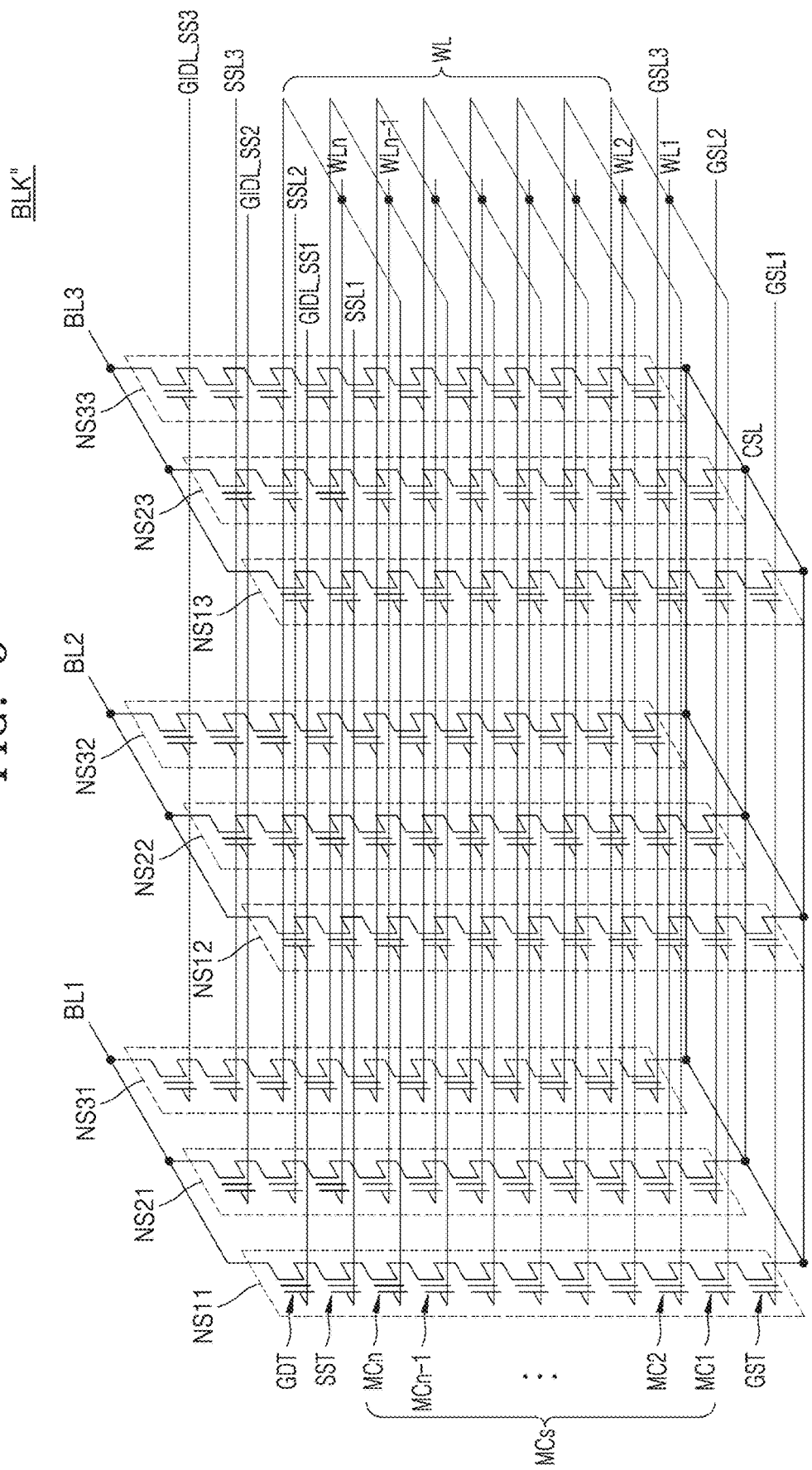

FIG. 5 is a circuit diagram illustrating a memory block BLK" according to an embodiment.

Referring to FIG. 5, the memory block BLK" may correspond to one of the plurality of memory blocks BLK1 to BLKz of FIG. 2. The memory block BLK" corresponds to a modified example of the memory block BLK of FIG. 3, and hereinafter, description will focus on differences from the memory block BLK of FIG. 3. The memory block BLK" may include the NAND strings NS11 to NS33 that may be connected to the first to third bit lines BL1 to BL3, the first to third erase control lines GIDL_SS1 to GIDL_SS3, the first to third string select lines SSL1 to SSL3, the word lines WL, and the ground select lines GSL1 to GSL3, and extend in the vertical direction VD, respectively. When compared with the memory block BLK of FIG. 3, the memory block BLK" may not include the ground erase control lines GIDL_GS, and each NAND string may not include the ground erase control transistor GDT_GS.

Figure 6A:
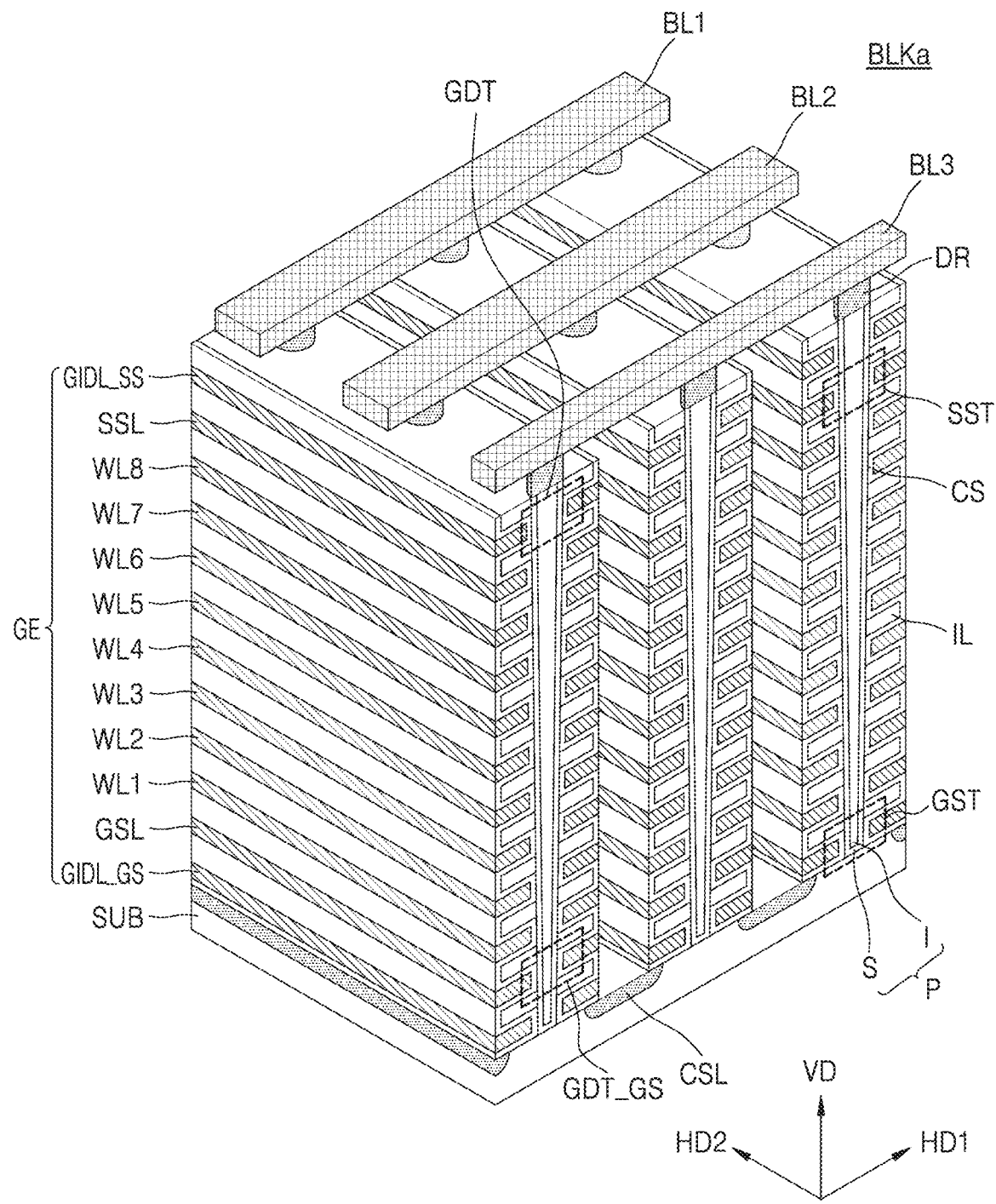
FIGS. 6A and 6B are respectively perspective views illustrating memory blocks according to some embodiments.

FIG. 6A is a perspective view illustrating a memory block BLKa according to an embodiment.

Referring to FIG. 6A, the memory block BLKa may correspond to one of the plurality of memory blocks BLK1 to BLKz of FIG. 2. The memory block BLKa is formed in the vertical direction VD with respect to a substrate SUB. The substrate SUB has a first conductivity type (e.g., a p-type), and extends on the substrate SUB in the second horizontal direction HD2. In an embodiment, the common source line CSL doped with second conductivity-type (e.g., n-type) impurities may be provided to the substrate SUB. In an embodiment, the substrate SUB may include polysilicon, and the common source line CSL, which is a plate-type, may be arranged on the substrate SUB. A plurality of insulating layers IL extending in the second horizontal direction HD2 are sequentially provided on the substrate SUB in the vertical direction VD, and the plurality of insulating layers IL are arranged apart from each other by a certain distance in the vertical direction VD. For example, the plurality of insulating layers IL may include an insulating material such as silicon oxide.

A plurality of pillars P sequentially arranged in the first horizontal direction HD1 and passing through the plurality of insulating layers IL in the vertical direction VD are provided on the substrate SUB. For example, the plurality of pillars P may pass through the plurality of insulating layers IL to be in contact with the substrate SUB. In detail, a surface layer S of each pillar P may include a first-type silicon material and function as a channel region. Accordingly, in some embodiments, the pillars P may be referred to as a channel structure or a vertical channel structure. In addition, an inner layer I of each pillar P may include an insulating material such as silicon oxide or an air gap.

A charge storage layer CS is provided along exposed surfaces of the insulating layers IL, the pillars P, and the substrate SUB. The charge storage layer CS may include a gate insulating layer (also referred to as a 'tunneling insulating layer'), a charge trapping layer, and a blocking insulating layer. For example, the charge storage layer CS may have an oxide-nitride-oxide (ONO) structure. In addition, gate electrodes GE such as the ground erase control line GIDL_GS, the ground select line GSL, word lines WL1 to WL8, the string select line SSL, and an erase control line GIDL_SS are provided on the exposed surface of the charge storage layer CS. The number of ground erase control lines GIDL_GS, the number of ground select lines GSL, the number of word lines WL1 to WL8, the number of string select lines SSL, and the number of erase control lines GIDL_SS may be variously changed according to embodiments.

Drain contacts or drains DR are provided on the plurality of pillars P, respectively. For example, the drains DR may include a silicon material doped with the second conductivity-type impurities. The bit lines BL1 to BL3 extending in the first horizontal direction HD1 and arranged apart from each other by a certain distance in the second horizontal direction HD2 are provided on the drains DR.

Figure 6B:
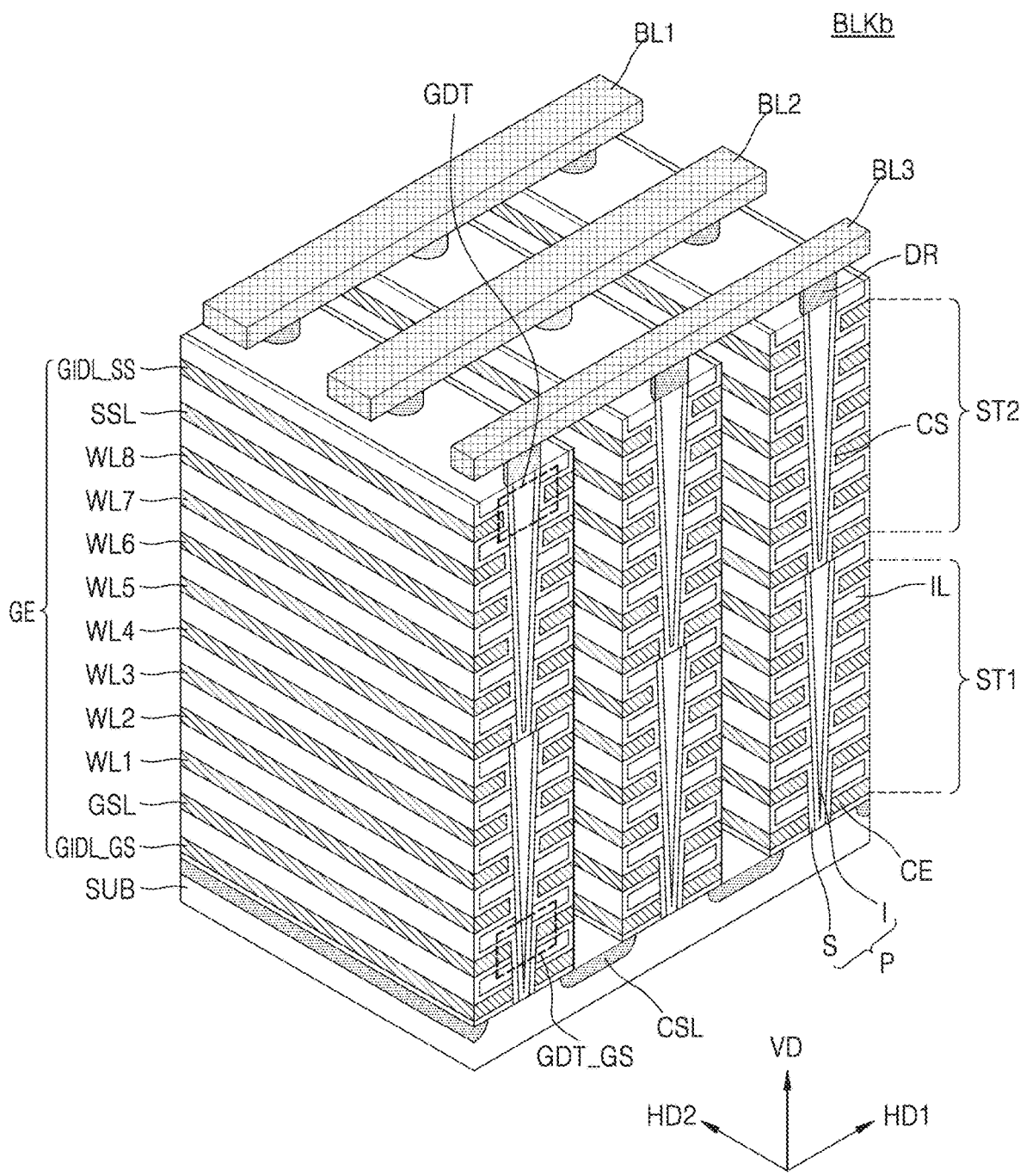

FIG. 6B is a perspective view illustrating a memory block BLKb according to an embodiment.

Referring to FIG. 6B, the memory block BLKb may correspond to one of the plurality of memory blocks BLK1 to BLKz of FIG. 2. Also, the memory block BLKb corresponds to a modified example of the memory block BLKa of FIG. 6A, and the description provided above with reference to FIG. 6A may also apply to the present embodiment. The memory block BLKb is formed in the vertical direction VD with respect to the substrate SUB. The memory block BLKb may include a first memory stack ST1 and a second memory stack ST2 that are stacked in the vertical direction VD. However, inventive concepts are not limited thereto, and the memory block BLKb may include three or more memory stacks.

Figure 7:
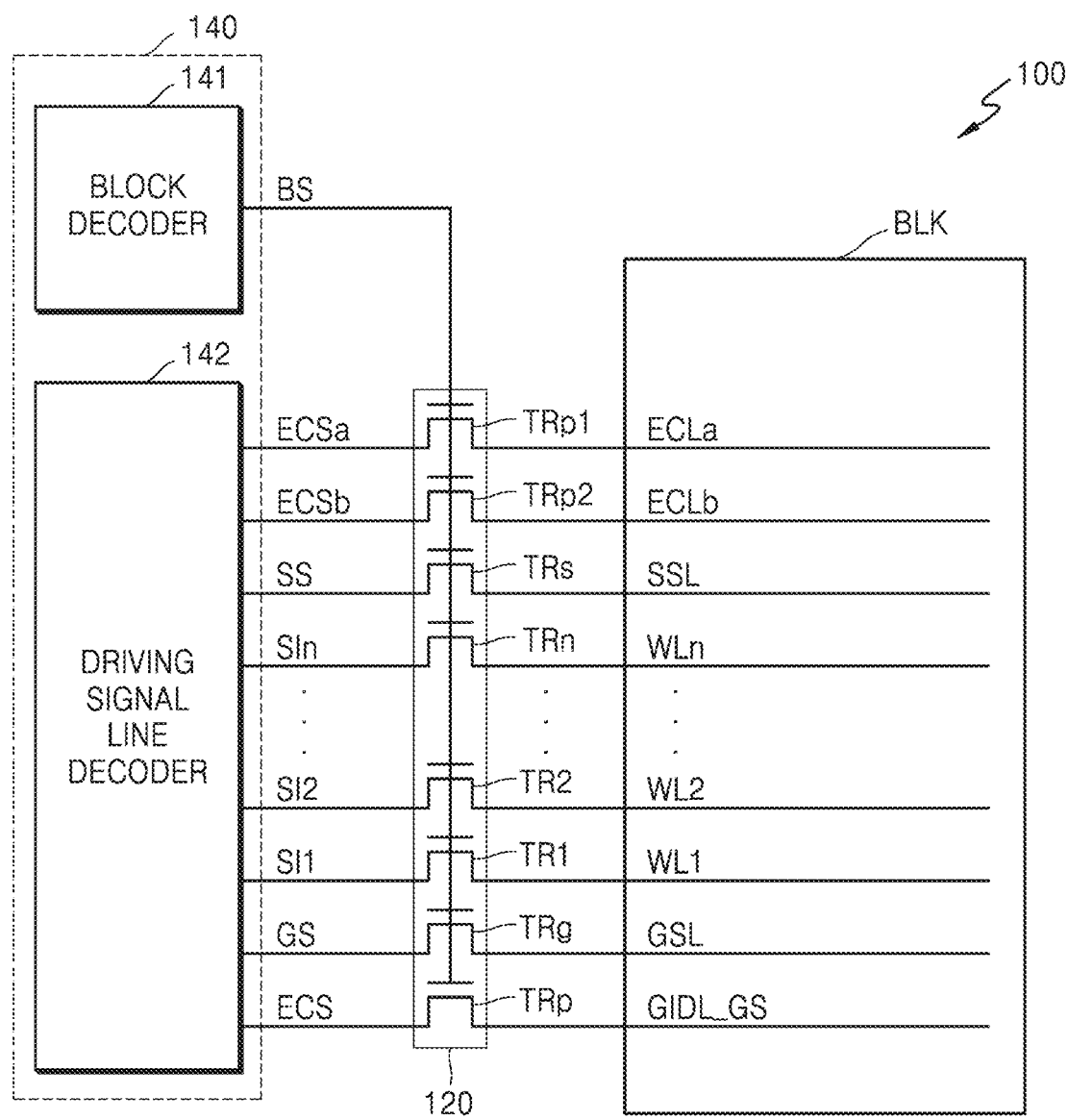
FIGS. 7 to 9 respectively illustrate connection between a memory block, a pass transistor circuit, and a row decoder, according to some embodiments.

FIG. 7 illustrates a connection between the memory block BLK, the pass transistor circuit 120, and the row decoder 140, according to an embodiment.

Referring to FIG. 7, the memory device 100 may include the memory block BLK, the pass transistor circuit 120, and the row decoder 140, and the row decoder 140 may include a block decoder 141 and a driving signal line decoder 142. The pass transistor circuit 120 may include a plurality of pass transistors TRp, TRg, TR1 to TRn, TRs, TRp1, and TRp2. The block decoder 141 may be connected to the pass transistor circuit 120 through a block selection signal line BS. The block selection signal line BS may be connected to gates of the plurality of pass transistors TRp, TRg, TR1 to TRn, TRs, TRp1, and TRp2. For example, when a block selection signal provided via the block selection signal line BS is activated, the plurality of pass transistors TRp, TRg, TR1 to TRn, TRs, TRp1, and TRp2 may be turned on, and accordingly, the memory block BLK may be selected.

The driving signal line decoder 142 may be connected to the pass transistor circuit 120 via the ground erase control line driving signal line ECS, the ground select line driving signal line GS, word line driving signal lines SI1 to SIn, the string select line driving signal line SS, and the first and second erase control line driving signal lines ECSa and ECSb. In detail, the ground erase control line driving signal line ECS, the ground select line driving signal line GS, the word line driving signal lines SI1 to SIn, the string select line driving signal line SS, and the first and second erase control line driving signal lines ECSa and ECSb may be respectively connected to sources of the plurality of pass transistors TRp, TRg, TR1 to TRn, TRs, TRp1 and TRp2.

The pass transistor circuit 120 may be connected to the memory block BLK via the ground erase control line GIDL_GS, the ground select line GSL, the word lines WL1 to WLn, the string select line SSL, and the first and second erase control lines ECLa and ECLb. The first pass transistor TRp1 may be connected between the first erase control line driving signal line ECSa and the first erase control line ECLa, and the first erase control line ECLa may correspond to a line in which the erase control lines of the first group (e.g., GIDL_SSa of FIG. 1) are merged. The second pass transistor TRp2 may be connected between the second erase control line driving signal line ECSb and the second erase control line ECLb, and the second erase control line ECLb may correspond to a line in which the erase control lines of the second group (e.g., GIDL_SSb of FIG. 1) are merged.

The pass transistor TRp may be connected between the ground erase control line driving signal line ECS and the ground erase control line GIDL_GS. The pass transistor TRg may be connected between the ground select line driving signal line GS and the ground select line GSL. The pass transistors TR1 to TRn may be respectively connected between the word line driving signal lines SI1 to SIn and the plurality of word lines WL1 to WLn. The pass transistor TRs may be connected between the string select line driving signal line SS and the string select line SSL.

For example, when a block selection signal is activated, the pass transistors TRp, TRg, TR1 to TRn, TRs, TRp1, and TRp2 may provide driving signals, which are provided via the ground erase control line driving signal line ECS, the ground select line driving signal line GS, the word line driving signal lines SI1 to SIn, the string select line driving signal line SS, and the first and second erase control line driving signal lines ECSa and ECSb, to the ground erase control line GIDL_GS, the ground select line GSL, the word lines WL1 to WLn, the string select line SSL, and the first and second erase control lines ECLa and ECLb, respectively.

Figure 8:
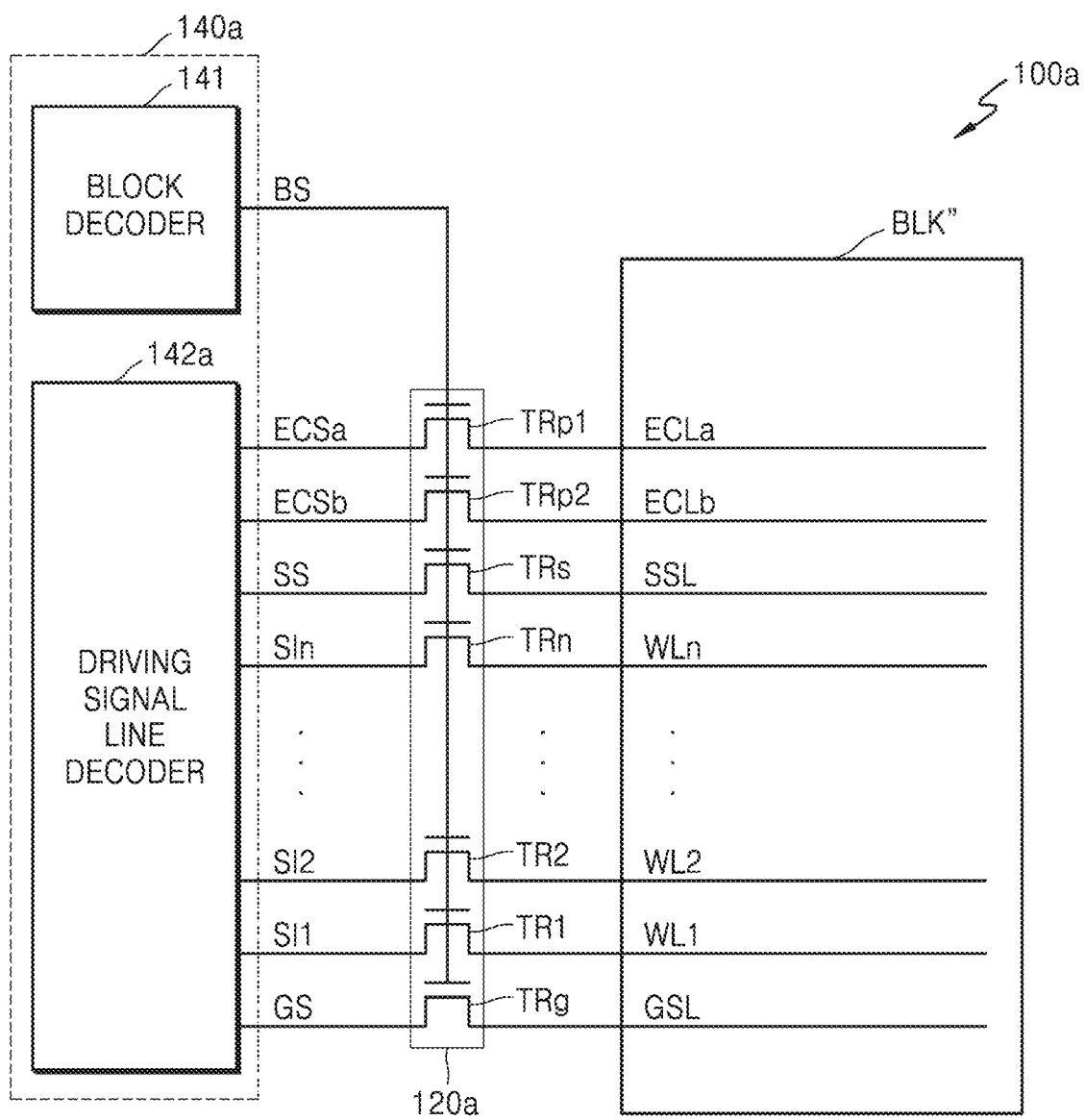

FIG. 8 illustrates a connection between the memory block BLK", a pass transistor circuit 120a, and a row decoder 140a), according to an embodiment.

Referring to FIG. 8, a memory device 100a may include the memory block BLK", the pass transistor circuit 120a, and the row decoder 140a, and the row decoder 140a may include the block decoder 141 and a driving signal line decoder 142a. The pass transistor circuit 120a may include a plurality of pass transistors TRg, TR1 to TRn, TRs, TRp1, and TRp2. The memory block BLK" may correspond to the memory block BLK" of FIG. 5, and the memory device 100a may correspond to a modified example of the memory device 100 of FIG. 7, and repeated descriptions thereof are omitted. Compared to the memory block BLK of FIG. 7, the memory block BLK" may not include the ground erase control line GIDL_GS, and accordingly, the pass transistor circuit 120a may not include the pass transistor TRp connected to the ground erase control line GIDL_GS.

Figure 9:
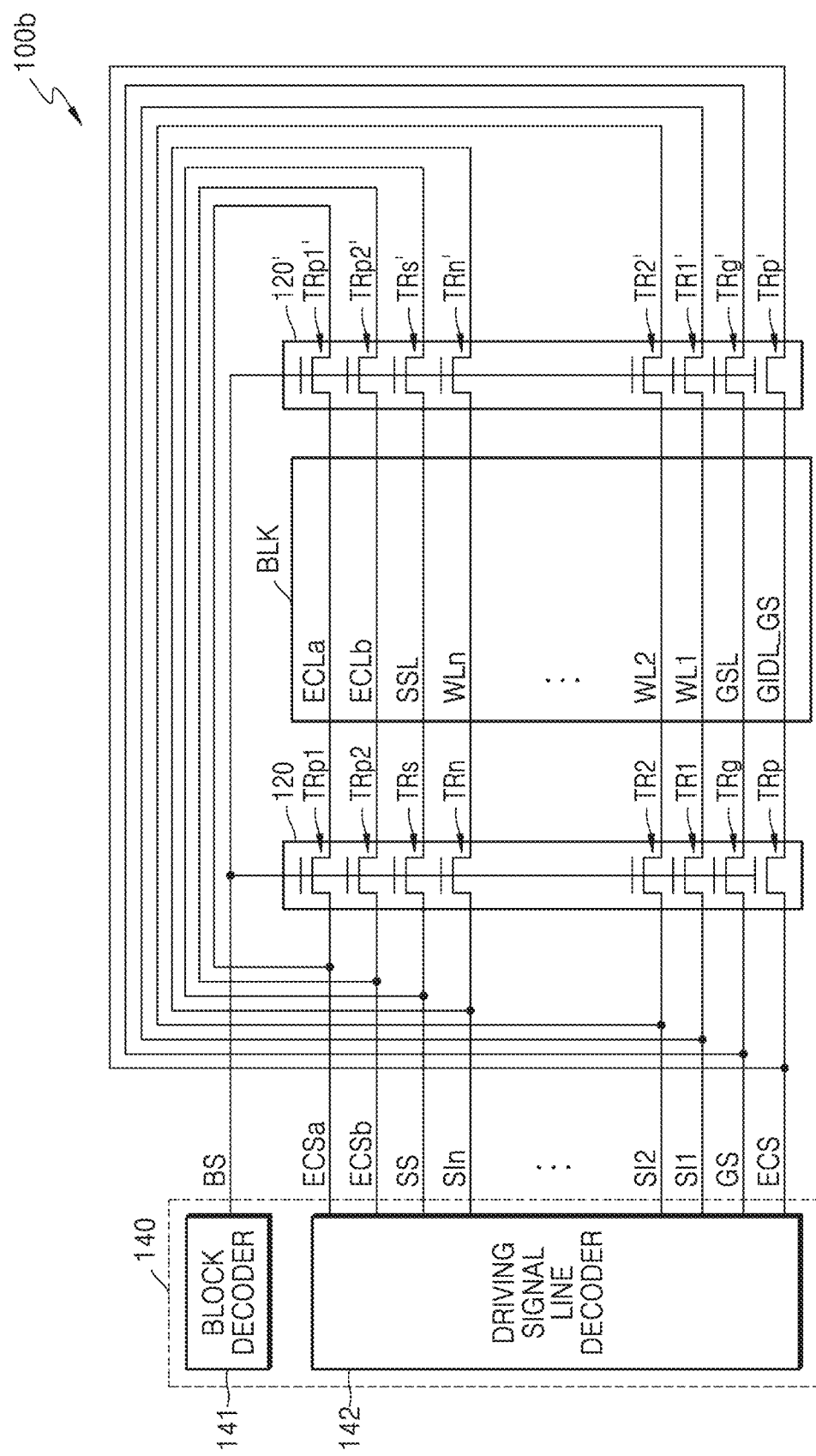

FIG. 9 illustrates a connection between the memory block BLK, pass transistor circuits 120 and 120", and the row decoder 140, according to an embodiment.

Referring to FIG. 9, a memory device 100b may include the memory block BLK, the pass transistor circuits 120 and 120', and the row decoder 140, and the pass transistor circuit 120 may be arranged at one side of the memory block BLK, for example, on the left side thereof, and the pass transistor circuit 120' may be arranged at the other side of the memory block BLK, for example, on the right side thereof. The pass transistor circuit 120 may include the plurality of pass transistors TRp, TRg, TR1 to TRn, TRs, TRp1, and TRp2, and the pass transistor circuit 120' may include a plurality of pass transistors TRp', TRg', TR1' to TRn', TRs', TRp1', and TRp2'. The memory device 100b may correspond to a modified example of the memory device 100 of FIG. 7, and repeated descriptions thereof are omitted.

The block decoder 141 may be connected to the pass transistor circuits 120 and 120' via the block selection signal line BS. The block selection signal line BS may be connected to the plurality of pass transistors TRp, TRg, TR1 to TRn, TRs, TRp1, TRp2, TRp', TRg', TR1' to TRn', TRs', TRp1', and TRp2'. The driving signal line decoder 142 may be connected to the pass transistor circuits 120 and 120' via the ground erase control line driving signal line ECS, the ground select line driving signal line GS, the word line driving signal lines SI1 to SIn, the string select line driving signal line SS, and the first and second erase control line driving signal lines ECSa and ECSb.

According to the present embodiment, first pass transistors TRp1 and TRp1' may be arranged at both ends of the first erase control line ECLa, and second pass transistors TRp2 and TRp2' may be arranged at both ends of the second erase control line ECLb. However, inventive concepts are not limited thereto, and in some embodiments, the first pass transistor TRp1 connected to the first erase control line ECLa may be arranged at one side of each memory block, and the second pass transistor TRp2' connected to the second erase control line ECLb may be arranged at the other side of each memory block.

Also, pass transistors may be arranged at both ends of the plurality of word lines WL1 to WLn. For example, the pass transistors TR1 and TR1' may be arranged at both ends of a first word line WL1. However, inventive concepts are not limited thereto, and in some embodiments, pass transistors connected to odd-numbered word lines may be arranged at one side of each memory block, and pass transistors connected to even-numbered word lines may be arranged at the other side of each memory block.

Figure 10:
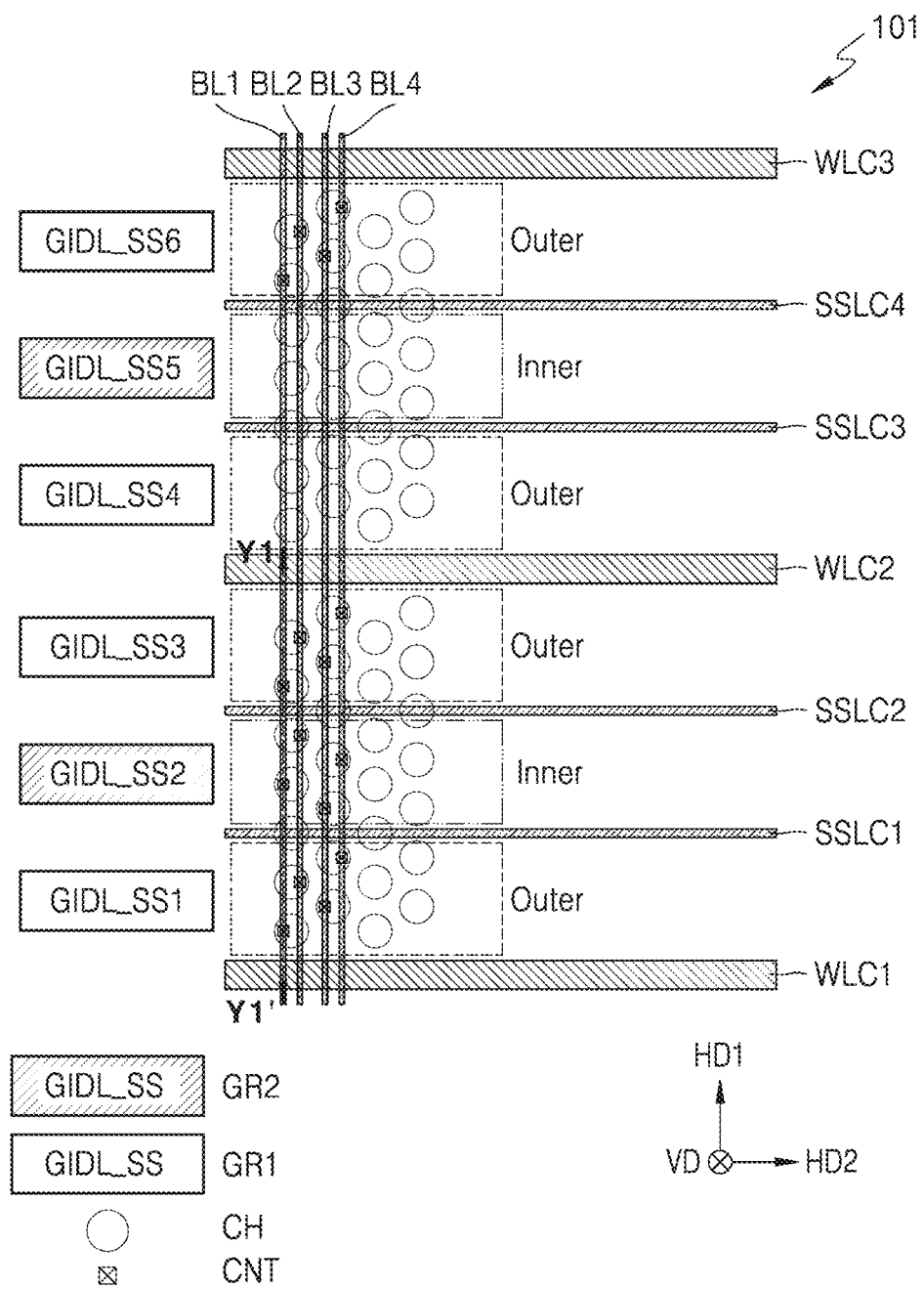
FIG. 10 is a plan view illustrating a memory device according to an embodiment.

FIG. 10 is a plan view illustrating a memory device 101 according to an embodiment.

Referring to FIG. 10, the memory device 101 may include first to third word line cut regions WLC1, WLC2, and WLC3 that are arranged apart from each other in the first horizontal direction HD1 and extend in the second horizontal direction HD2, respectively. In some embodiments, the first to third word line cut regions WLC1, WLC2, and WLC3 may be referred to as first to third word line structures, respectively. For example, each memory block may be arranged in a region defined by three adjacent word line cut regions, that is, the first to third word line cut regions WLC1, WLC2, and WLC3. However, inventive concepts are not limited thereto, and each memory block may be arranged in a region defined by two adjacent word line cut regions. Also, each memory block may be arranged in a region defined by four or more word line cut regions.

A single word line may be divided into a first region defined by the first and second word line cut regions WLC1 and WLC2 and a second region defined by the second and third word line cut regions WLC2 and WLC3. According to an embodiment, each of the first and second regions may be referred to as a word line bar. Accordingly, each memory block may include two word line bars (e.g., WL_BARa and WL_BARb of FIG. 12). However, inventive concepts are not limited thereto, and each memory block may include one word line bar. Also, each memory block may include three or more word line bars.

The memory device 101 may further include first and second string select line cut regions SSLC1 and SSLC2 between the first and second word line cut regions WLC1 and WLC2 and third and fourth string select line cut regions SSLC3 and SSLC4 between the second and third word line cut regions WLC2 and WLC3. The first to fourth string select line cut regions SSLC1 to SSLC4 may be arranged apart from each other in the first horizontal direction HD1 and extend in the second horizontal direction HD2. In some embodiments, the first to fourth string select line cut regions SSLC1 to SSLC4 may be referred to as first to fourth string select line cut structures, respectively.

As described above, each memory block of the memory device 101 may have a 6SSL structure including six string select lines defined by the first to third word line cut regions WLC1 to WLC3 and the first to fourth string select line cut regions SSLC1 to SSLC4. First to sixth erase control lines GIDL_SS1 to GIDL_SS6 may be arranged in regions defined by the first to third word line cut regions WLC1, WLC2, and WLC3 and the first to fourth string select line cut regions SSLC1 to SSLC4, respectively.

In detail, the first erase control line GIDL_SS1 may be arranged between the first word line cut region WLC1 and the first string select line cut region SSLC1, and the second erase control line GIDL_SS2 may be arranged between the first and second string select line cut regions SSLC1 and SSLC2, and the third erase control line GIDL_SS3 may be arranged between the second string select line cut region SSLC2 and the second word line cut region WLC2. Also, the fourth erase control line GIDL_SS4 may be arranged between the second word line cut region WLC2 and the third string select line cut region SSLC3, and the fifth erase control line GIDL_SS5 may be arranged between the third and fourth string select line cut regions SSLC3 and SSLC4, and the sixth erase control line GIDL_SS6 may be arranged between the fourth string select line cut region SSLC4 and the third word line cut region WLC3.

The memory device 101 may further include a plurality of channel holes CH, a plurality of contacts CNT, and first to fourth bit lines BL1 to BL4. The first to fourth bit lines BL1 to BL4 may each extend in the first horizontal direction HD1 and may be arranged apart from each other in the second horizontal direction HD2. Some of the plurality of channel holes CH may be connected to one of the first to fourth bit lines BL1 to BL4 through corresponding contacts CNT. In addition, the contacts CNT may not be formed over the remaining channel holes among the plurality of channel holes CH, that is, over dummy holes, and the dummy holes may not be connected to the first to fourth bit lines BL1 to BL4. For example, the plurality of channel holes CH may be arranged in a honeycomb structure, but inventive concepts are not limited thereto. As described above, a structure in which each memory block includes the plurality of channel holes CH may be referred to as a "multi-hole structure".

The plurality of channel holes CH may be divided into inner channel holes and outer channel holes according to a distance thereof from an adjacent word line cut region. As the channel holes CH corresponding to the first erase control line GIDL_SS1 are relatively close to the first word line cut region WLC1, they may be classified as outer channel holes; as the channel holes CH corresponding to the third and fourth erase control lines GIDL_SS3, GIDL_SS4 are relatively close to the second word line cut region WLC2, they may be classified as outer channel holes; and as the channel holes CH corresponding to the sixth erase control line GIDL_SS6 are relatively close to the third word line cut region WLC3, they may be classified as outer channel holes. Accordingly, the first, third, fourth, and sixth erase control lines GIDL_SS1, GIDL_SS3, GIDL_SS4, and GIDL_SS6 may be included in a first erase control group or a first group GR1.

In addition, as the channel holes CH corresponding to the second erase control line GIDL_SS2 are relatively far from the first word line cut region WLC1 or the second word line cut region WLC2, they may be classified as inner channel holes, and as the channel holes CH corresponding to the fifth erase control line GIDL_SS5 are relatively far from the second word line cut region WLC2 or from the third word line cut region WLC3, they may be classified as inner channel holes. Accordingly, the second and fifth erase control lines GIDL_SS2 and GIDL_SS5 may be included in a second erase control group or a second group GR2.

Figure 11:
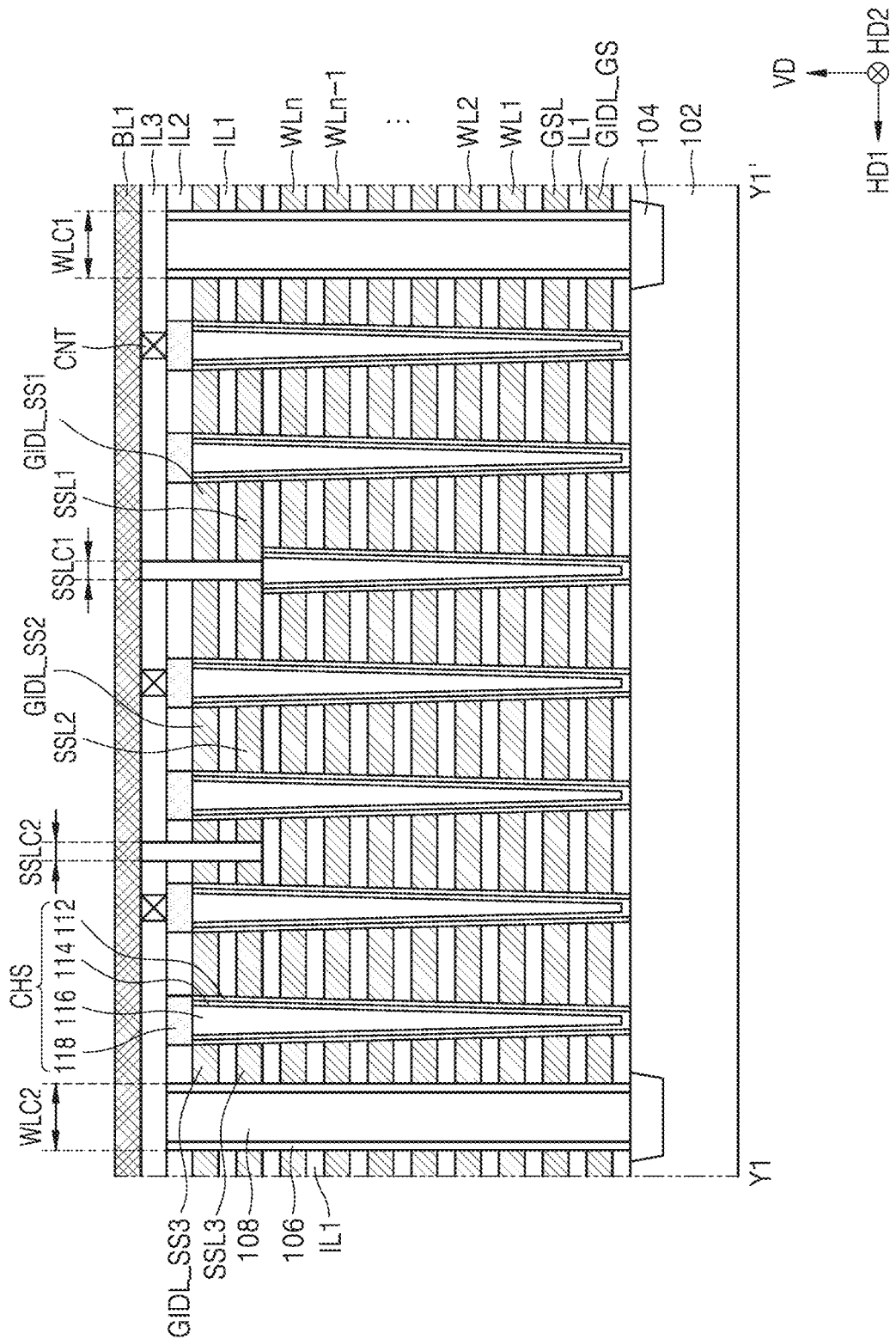
FIG. 11 is a cross-sectional view taken along line Y1-Y1' of FIG. 10, according to an embodiment.

FIG. 11 is a cross-sectional view taken along line Y1-Y1' of FIG. 10, according to an embodiment.

Referring to both FIGS. 10 and 11, a substrate 102 may have a main surface extending in the first horizontal direction HD1 and the second horizontal direction HD2. In an embodiment, the substrate 102 may include Si, Ge, or SiGe. In another embodiment, the substrate 102 may include a silicon-on-insulator (SOI) substrate or a germanium-on-insulator (GeOI) substrate. Common source regions 104 may extend in the substrate 102 in the second horizontal direction HD2. The common source regions 104 may have a function as a source region for supplying current to memory cells. In an embodiment, the common source regions 104 may be an impurity region that is highly doped with an n-type impurity. However, inventive concepts are not limited thereto, and in some embodiments, the common source regions 104 may be a doped polysilicon region.

The first and second word line cut regions WLC1 and WLC2 may extend in the second horizontal direction HD2 that is parallel to the main surface of the substrate 102. The first and second word line cut regions WLC1 and WLC2 may respectively define respective widths of the plurality of word lines WL1 to WLn. In other words, the plurality of word lines WL1 to WLn may be repeatedly arranged apart from each other by a certain distance by the first and second word line cut regions WLC1 and WLC2.

An insulation spacer 106 and a common source line 108 may be formed in each of the first and second word line cut regions WLC1 and WLC2. Each common source line 108 may extend on the corresponding common source region 104 in the second horizontal direction HD2. However, inventive concepts are not limited thereto, and in some embodiments, the first and second word line cut regions WLC1 and WLC2 may each include an insulation structure, and thus may be referred to as a word line cut structure. In embodiments, the insulation structure may include silicon oxide, silicon nitride, silicon oxynitride, or a low-permittivity material. For example, the insulation structure may include a silicon oxide film, a silicon nitride film, a SiON film, a SiOCN film, a SiCN film, or a combination thereof. In other embodiments, at least a portion of the insulation structure may include an air gap. As used herein, the term "air" refers to the atmosphere or other gases that may be present during the manufacturing process.

The ground erase control line GIDL_GS, the ground select line GSL, and the plurality of word lines WL1 to WLn may be sequentially stacked between the first and second word line cut regions WLC1 and WLC2. The plurality of word lines WL1 to WLn may extend in a horizontal direction parallel to the main surface of the substrate 102, and may be arranged apart from each other in the vertical direction VD perpendicular to the main surface of the substrate 102, to overlap each other. As described above, the plurality of word lines WL1 to WLn may be stacked on the substrate 102 in the vertical direction VD.

The first to third string select lines SSL1, SSL2, and SSL3 may be arranged on the plurality of word lines WL1 to WLn. The first to third string select lines SSL1, SSL2, and SSL3 may be separated from each other by the first and second string select line cut regions SSLC1 and SSLC2 and arranged apart from each other. The first to third erase control lines GIDL_SS1, GIDL_SS2, and GIDL_SS3 may be arranged on the first to third string select lines SSL1, SSL2, and SSL3. The first to third erase control lines GIDL_SS1, GIDL_SS2, and GIDL_SS3 may be separated from each other by the first and second string select line cut regions SSLC1 and SSLC2 and may be arranged apart from each other. For example, the first and second string select line cut regions SSLC1 and SSLC2 may be filled with an insulating layer. The insulating layer may include an oxide layer, a nitride layer, or a combination thereof. At least a portion of the first and second string select line cut regions SSLC1 and SSLC2 may be filled with an air gap.

The ground erase control line GIDL_GS, the ground select line GSL, the plurality of word lines WL1 to WLn, the first to third string select lines SSL1, SSL2, SSL3, and the first to third erase control lines GIDL_SS1, GIDL_SS2, and GIDL_SS3 may each include a metal, a metal silicide, a semiconductor doped with an impurity, or a combination thereof. For example, the erase control line GIDL_GS, the ground select line GSL, the plurality of word lines WL1 to WLn, the first to third string select lines SSL1, SSL2 and SSL3, and the first to third erase control lines GIDL_SS1, GIDL_SS2, and GIDL_SS3 may each include a metal such as tungsten, nickel, cobalt, or tantalum, a metal silicide such as tungsten silicide, nickel silicide, cobalt silicide, tantalum silicide, polysilicon doped with impurities, or a combination thereof. An insulating layer IL1 may be arranged between the substrate 102 and the erase control line GIDL_GS, between the erase control line GIDL_GS and the ground select line GSL, between the ground select line GSL and the word line WL1, between each two of the plurality of word lines WL1 to WLn, between the WLn and the first to third string select lines SSL1, SSL2, and SSL3, and between the first to third string select lines SSL1, SSL2, and SSL3 and the first to third erase control lines GIDL_SS1, GIDL_SS2, and GIDL_SS3. The insulating layer IL1 may include silicon oxide, silicon nitride, or silicon oxynitride.

A plurality of channel structures CHS may pass through the ground erase control line GIDL_GS, the ground select line GSL, the plurality of word lines WL1 to WLn, one of the first to third string select lines SSL1, SSL2, and SSL3, one of the first to third erase control lines GIDL_SS1, GIDL_SS2, and GIDL_SS3, and the plurality of insulating layers IL1 and extend in the vertical direction VD. The plurality of channel structures CHS may respectively correspond to the plurality of channel holes CH of FIG. 10. The plurality of channel structures CHS may be arranged apart from each other with a certain distance therebetween in the first horizontal direction HD1 and the second horizontal direction HD2.

Each of the plurality of channel structures CHS may include a gate dielectric layer 112, a channel region 114, a buried insulating layer 116, and a drain region 118. In an embodiment, a barrier metal layer may be formed between the gate dielectric layer 112 and the ground select line GSL, between the gate dielectric layer 112 and the plurality of word lines WL1 to WLn, and between the gate dielectric layer 112 and the corresponding string select lines SSL1, SSL2, or SSL3. The channel region 114 may include doped polysilicon and/or undoped polysilicon. The channel region 114 may have a cylindrical shape.

An inner space of the channel region 114 may be filled with the buried insulating layer 116. The buried insulating layer 116 may include an insulating material. For example, the buried insulating layer 116 may include silicon oxide, silicon nitride, silicon oxynitride, or a combination thereof. In an embodiment, the buried insulating layer 116 may be omitted, and in this case, the channel region 184 may have a pillar structure without an inner space. The drain region 118 may include a polysilicon layer doped with impurities. The plurality of drain regions 118 may be insulated from each other by an insulating layer IL2. The insulating layer IL2 may include an oxide layer, a nitride layer, or a combination thereof. Each drain region 118 may be connected to the one corresponding first bit line BL1 among the plurality of bit lines (e.g., BL of FIG. 2) via the plurality of contacts CNT. The plurality of contacts CNT may be insulated from each other by an insulating layer IL3.

In a manufacturing process of the memory device 101, the plurality of insulating layers IL1 and a plurality of sacrificial insulating layers (not shown) may be alternately stacked on the substrate 102 one by one. For example, the plurality of insulating layers IL1 may include a silicon oxide layer, and the plurality of sacrificial insulating layers may include a silicon nitride layer. Here, the plurality of sacrificial insulating layers may provide, in a subsequent process, a space for forming a plurality of gate lines including the ground erase control line GIDL_GS, the ground select line GSL, the plurality of word lines WL1 to WLn, the first to third string select lines SSL1, SSL2, and SSL3, the first to third erase control lines GIDL_SS1, GIDL_SS2, and GIDL_SS3, and the like. Subsequently, the plurality of channel structures CHS passing through the plurality of insulating layers IL1 and the plurality of sacrificial insulating layers may be formed. Next, the plurality of sacrificial insulating layers may be replaced with the plurality of gate lines through word line cut holes respectively corresponding to the first and second word line cut regions WLC1 and WLC2. Next, the word line cut holes may be filled with the insulation spacer 106 and the common source line 108.

Here, a thickness of each of the plurality of gate lines substituted from the plurality of sacrificial insulating layers, in the vertical direction VD, may vary according to a distance thereof from adjacent word line cut regions. For example, among gate lines arranged on the same level, a region relatively close to the first or second word line cut region WLC1 or WLC2 may be thicker in the vertical direction VD than regions that are relatively far from the first or second word line cut region WLC1 or WLC2. Accordingly, a thickness of a word line connected to inner memory cells formed in the inner channel holes, in the vertical direction VD, may be less than a thickness of a word line connected to outer memory cells formed in the outer channel holes, in the vertical direction VD. As a result, an erase speed of the inner memory cells formed in the inner channel holes may be different from an erase speed of the outer memory cells formed in the outer channel holes.

Figure 12:
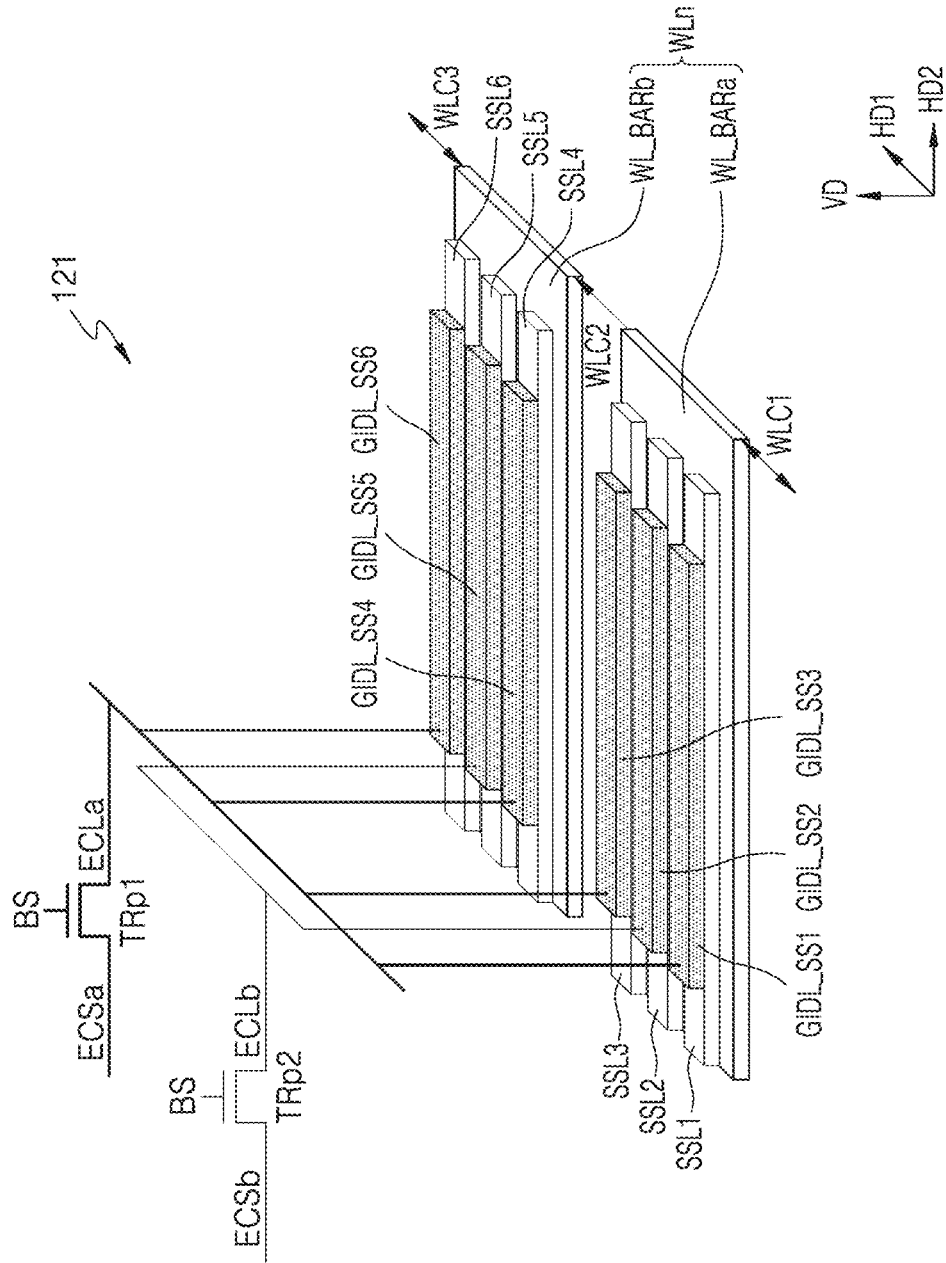
FIGS. 12 and 13 respectively illustrate a portion of a memory device according to some embodiments.

FIG. 12 illustrates a portion of a memory device 121 according to an embodiment.

Referring to FIG. 12, the memory device 121 may correspond to an embodiment of the memory device 101 of FIG. 10, and the description provided above with reference to FIGS. 10 and 11 may also apply to the present embodiment. An n-th word line WLn may include a first word line bar WL_BARa defined by the first and second word line cut regions WLC1 and WLC2 and a second word line bar WL_BARb defined by the second and third word line cut regions WLC2 and WLC3.

First to third string select lines SSL1, SSL2, and SSL3 may be arranged above the first word line bar WL_BARa, and first to third erase control lines GIDL_SS1, GIDL_SS2, and GIDL_SS3 may be arranged above the first to third string select lines SSL1, SSL2, and SSL3, respectively. Fourth to sixth string select lines SSL4, SSL5, and SSL6 may be arranged above the second word line bar WL_BARb, and fourth to sixth erase control lines GIDL_SS4, GIDL_SS5, and GIDL_SS6 may be arranged above the fourth to sixth string select lines SSL4, SSL5, and SSL6, respectively.

Although not illustrated, an insulating layer (e.g., IL1 of FIG. 1) may also be arranged between the n-th word line WLn and the first to sixth string select lines SSL1 to SSL6, and between the first to sixth string select lines SSL1 to SSL6 and the first to sixth erase control lines GIDL_SS1 to GIDL_SS6. In some embodiments, at least one dummy word line may be further arranged between the nth word line WLn and the first to sixth string select lines SSL1 to SSL6.

In an embodiment, the first, third, fourth, and sixth erase control lines GIDL_SS1, GIDL_SS3, GIDL_SS4, GIDL_SS6 may be included in the first group GR1, and the second and fifth erase control lines GIDL_SS2 and GIDL_SS5 may be included in the second group GR2. Here, the first, third, fourth, and sixth erase control lines GIDL_SS1, GIDL_SS3, GIDL_SS4, and GIDL_SS6 of the first group GR1 may correspond to the erase control lines GIDL_SSa of the first group of FIGS. 1 and 2, and the second and fifth erase control lines GIDL_SS2 and GIDL_SS5 of the second group GR2 may correspond to the erase control lines GIDL_SSb of the second group of FIGS. 1 and 2. For example, the first, third, fourth, and sixth erase control lines GIDL_SS1, GIDL_SS3, GIDL_SS4, and GIDL_SS6 of the first group GR1 may be merged into the first erase control line ECLa, and the second and fifth erase control lines GIDL_SS2 and GIDL_SS5 of the second group GR2 may be merged into the second erase control line ECLb, and the first erase control line ECLa and the second erase control line ECLb may be separated from each other.

Accordingly, the first pass transistor TRp1 may be connected between the first erase control line driving signal line ECSa and the first erase control line ECLa, and the first erase control line ECLa may be connected to the first, third, fourth, and sixth erase control lines GIDL_SS1, GIDL_SS3, GIDL_SS4, and GIDL_SS6. Also, the second pass transistor TRp2 may be connected between the second erase control line driving signal line ECSb and the second erase control line ECLb, and the second erase control line ECLb may be connected to the second and fifth erase control lines GIDL_SS2 and GIDL_SS5. Gates of the first and second pass transistors TRp1 and TRp2 may be connected to the block selection signal line BS.

Figure 13:
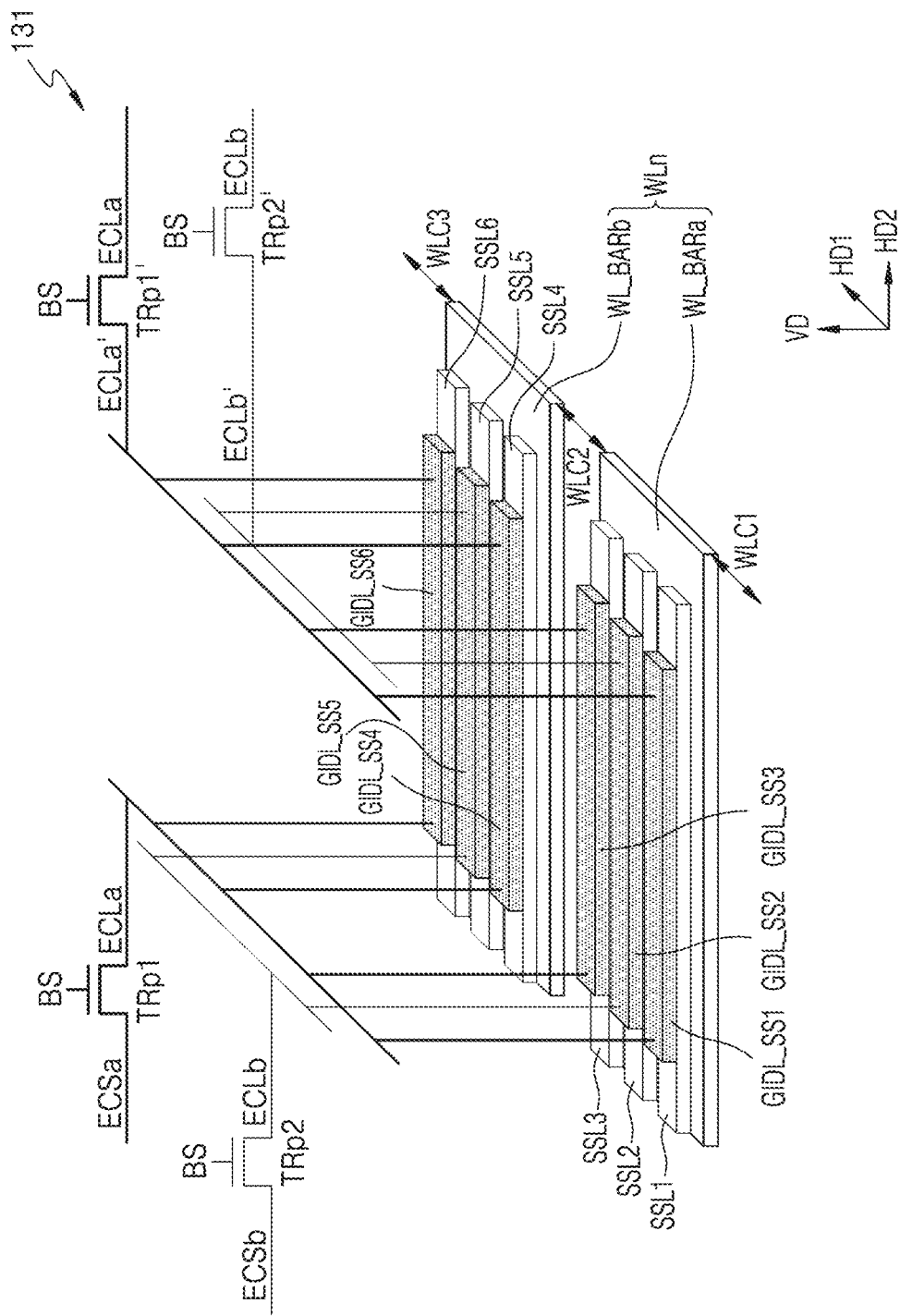

FIG. 13 illustrates a portion of a memory device 131 according to an embodiment.

Referring to FIG. 13, the memory device 131 may correspond to an embodiment of the memory device 101 of FIG. 10, and may correspond to a modified example of the memory device 121 of FIG. 12, and thus the description provided above with reference to FIGS. 10 to 12 may also be apply to the present embodiment. In an embodiment, the first, third, fourth, and sixth erase control lines GIDL_SS1, GIDL_SS3, GIDL_SS4, and GIDL_SS6 may be included in the first group GR1, and the second and fifth erase control lines GIDL_SS1, GIDL_SS3, GIDL_SS4, and GIDL_SS6 GIDL_SS2 and GIDL_SS5 may be included in the second group GR2. The first and second pass transistors TRp1 and TRp2 may be connected to corresponding ends of the first to sixth erase control lines GIDL_SS1 to GIDL_SS6, and the first and second pass transistors TRp1' and TRp2' may be connected to the other ends first to sixth erase control lines GIDL_SS1 to GIDL_SS6.

The first pass transistor TRp1' may be connected between the first erase control line driving signal line ECSa and an erase control line ECLa', and the erase control line ECLa' may be connected to the first, third, fourth, and sixth erase control lines GIDL_SS1, GIDL_SS3, GIDL_SS4, and GIDL_SS6. Also, the second pass transistor TRp2' may be connected between the second erase control line driving signal line ECSb and an erase control line ECLb', and the erase control line ECLb' may be connected to the second and fifth erase control lines GIDL_SS2 and GIDL_SS5. Gates of the first and second pass transistors TRp1' and TRp2' may be connected to the block selection signal line BS.

Figure 14:
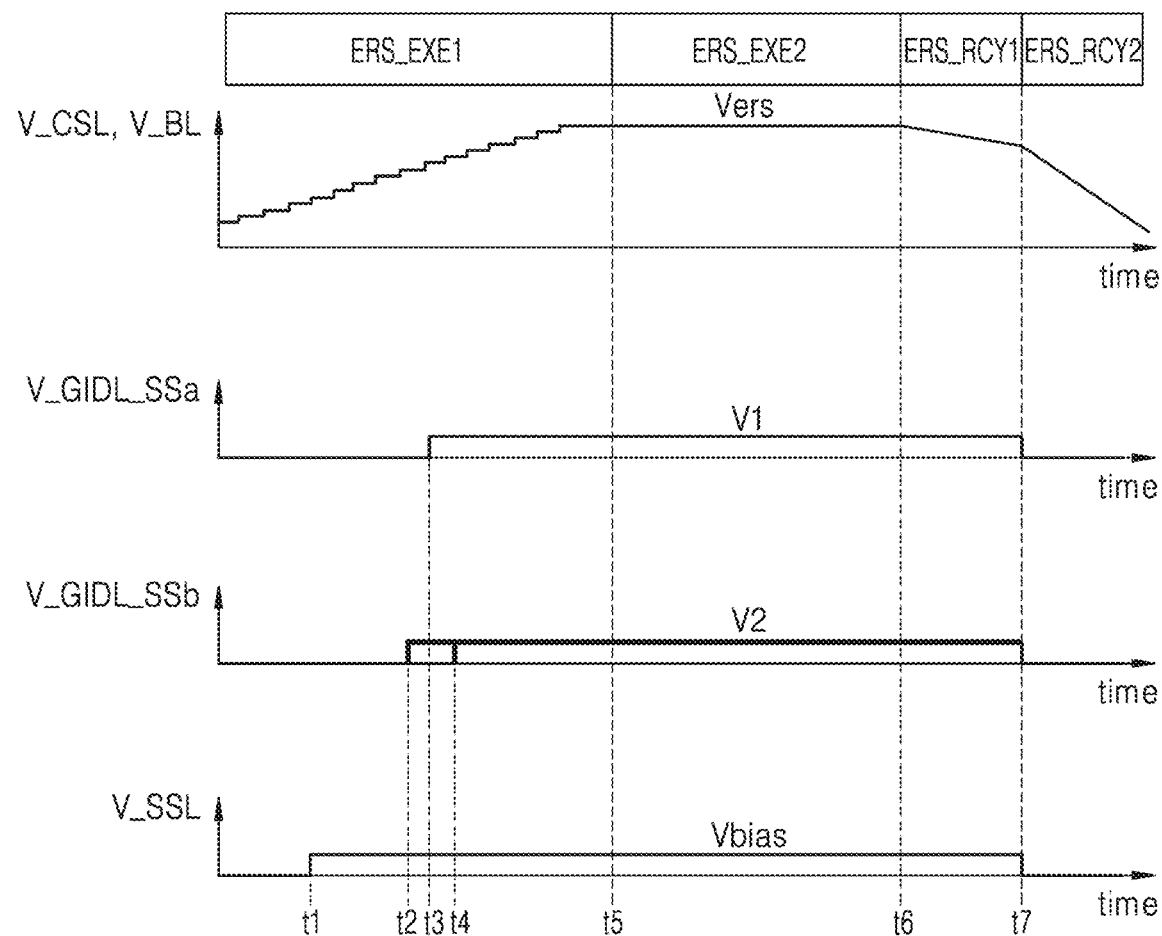
FIGS. 14 to 16 are circuit diagrams respectively illustrating an erase operation of a memory device, according to some embodiments.

FIG. 14 is a timing diagram illustrating an erase operation of a memory device according to an embodiment.

Referring to FIG. 14, the erase operation may be performed during an erase period including a first erase execution period ERS_EXE1, a second erase execution period ERS_EXE2, a first erase recovery period ERS_RCY1, and a second erase recovery period ERS_RCY2. For example, the erase operation according to the present embodiment may be an erase operation on the memory block BLK of FIG. 3, and may be referred to as a "GIDL erase operation". According to an embodiment, the GIDL erase operation may include a lower GIDL erase operation of injecting an erase voltage Vers into a common source line through the control of a common source line voltage V_CSL, an upper GIDL erase operation of injecting the erase voltage Vers into a bit line through the control of a bit line voltage V_BL, and a bidirectional GIDL erase operation of injecting the erase voltage Vers into the common source line and the bit line through the control of the common source line voltage V_CSL and the bit line voltage V_BL.

The first erase execution period ERS_EXE1 may correspond to a step-up period of the common source line voltage V_CSL or the bit line voltage V_BL, and in the first erase execution period ERS_EXE1, the common source line voltage V_CSL or the bit line voltage V_BL may be stepped up until the erase voltage Vers, which is a target voltage, is reached. The second erase execution period ERS_EXE2 may be from a fifth time point t5 to a sixth time point t6, and in the second erase execution period ERS_EXE2, the common source line voltage V_CSL or the bit line voltage V_BL may maintain the erase voltage Vers. The first erase recovery period ERS_RCY1 may be from the sixth time point t6 to a seventh time point t7, and in the first erase recovery period ERS_RCY1, the common source line voltage V_CSL or the bit line voltage V_BL may drop to a certain voltage level. In the second erase recovery period ERS_RCY2, the common source line voltage V_CSL or the bit line voltage V_BL may drop to, for example, a ground level. The string select line voltage V_SSL may maintain a bias voltage level Vbias for a period of time from the first time point t1 to the seventh time point t7.

In the lower GIDL erase operation, in the first erase execution period ERS_EXE1, when the common source line voltage V_CSL rises to a voltage level greater than or equal to a GIDL voltage, which is the minimum voltage for generating GIDL, holes are generated at a source edge of a ground erase control transistor (e.g., GDT_GS of FIG. 3), and accordingly, channels are charged from the end of the common source line CSL of the NAND strings (e.g., NS11 to NS33 of FIG. 3). In the second erase execution period ERS_EXE2, when the common source line voltage V_CSL rises to the erase voltage Vers, charging of the channels continues from the end of the common source line CSL.

In the upper GIDL erase operation, in the first erase execution period ERS_EXE1, when the bit line voltage V_BL rises to the voltage level greater than or equal to the GIDL voltage, which is a minimum voltage for generating GIDL, holes are generated at a source edge of an erase control transistor (e.g., GDT of FIG. 3), and accordingly, the channels are charged from the end of the bit line BL of the NAND strings (e.g., NS11 to NS33 of FIG. 3). In the second erase execution period ERS_EXE2, when the bit line voltage V_BL rises to the erase voltage Vers, charging of the channels continues from the end of the bit line BL.

In the bidirectional GIDL erase operation, in the first erase execution period ERS_EXE1, when the common source line voltage V_CSL and the bit line voltage V_BL rise to the voltage level greater than or equal to the GIDL voltage, which is a minimum voltage for generating GIDL, holes are generated at the source edge of the ground erase control transistor (e.g., GDT_GS in FIG. 3) and at the source edge of the erase control transistor (e.g., GDT in FIG. 3), and accordingly, the channels are charged from the end of the common source line CSL and the end of the bit line BL of the NAND strings (e.g., NS11 to NS33 of FIG. 3). In the second erase execution period ERS_EXE2, when the common source line voltage V_CSL and the bit line voltage V_BL rise to the erase voltage Vers, charging of the channels continues from the end of the common source line CSL and the end of the bit line BL.

During the erase operation, a first erase control voltage V_GIDL_SSa applied to the erase control lines GIDL_SSa of the first group may maintain a first voltage level V1, and a second erase control voltage V_GIDL_SSb applied to the erase control lines of the second group may maintain a second voltage level V2. In an embodiment, the first voltage level V1 may be different from the second voltage level V2. For example, the first voltage level V1 may be higher than the second voltage level V2. However, inventive concepts are not limited thereto, and in some embodiments, the first voltage level V1 may be the same as the second voltage level V2.

During the erase operation, an application time of the first erase control voltage V_GIDL_SSa may correspond to a time period from a third time point t3 to the seventh time point t7. In other words, an application start time of the first erase control voltage V_GIDL_SSa may correspond to the third time point t3, and for example, at the third time point t3, the first erase control voltage V_GIDL_SSa may rise from the ground level to the first voltage level V1. Also, an application end time point of the first erase control voltage V_GIDL_SSa may correspond to the seventh time point t7, and, for example, at the seventh time point t7, the first erase control voltage V_GIDL_SSa may drop from the first voltage level V1 to ground level.

In an embodiment, an application start time of the second erasing control voltage V_GIDL_SSb may correspond to a second time point t2 which is earlier than the third time point t3 or a fourth time point t4 which is later than the third time point t3. Accordingly, an application time of the second erase control voltage V_GIDL_SSb may be different from the application time of the first erase control voltage V_GIDL_SSa. However, inventive concepts are not limited thereto, and in some embodiments, the application time of the second erase control voltage V_GIDL_SSb may be the same as the application time of the first erase control voltage V_GIDL_SSa, and for example, the application start time of the erase control voltage V_GIDL_SSb may correspond to the third time point t3.

Figure 15:
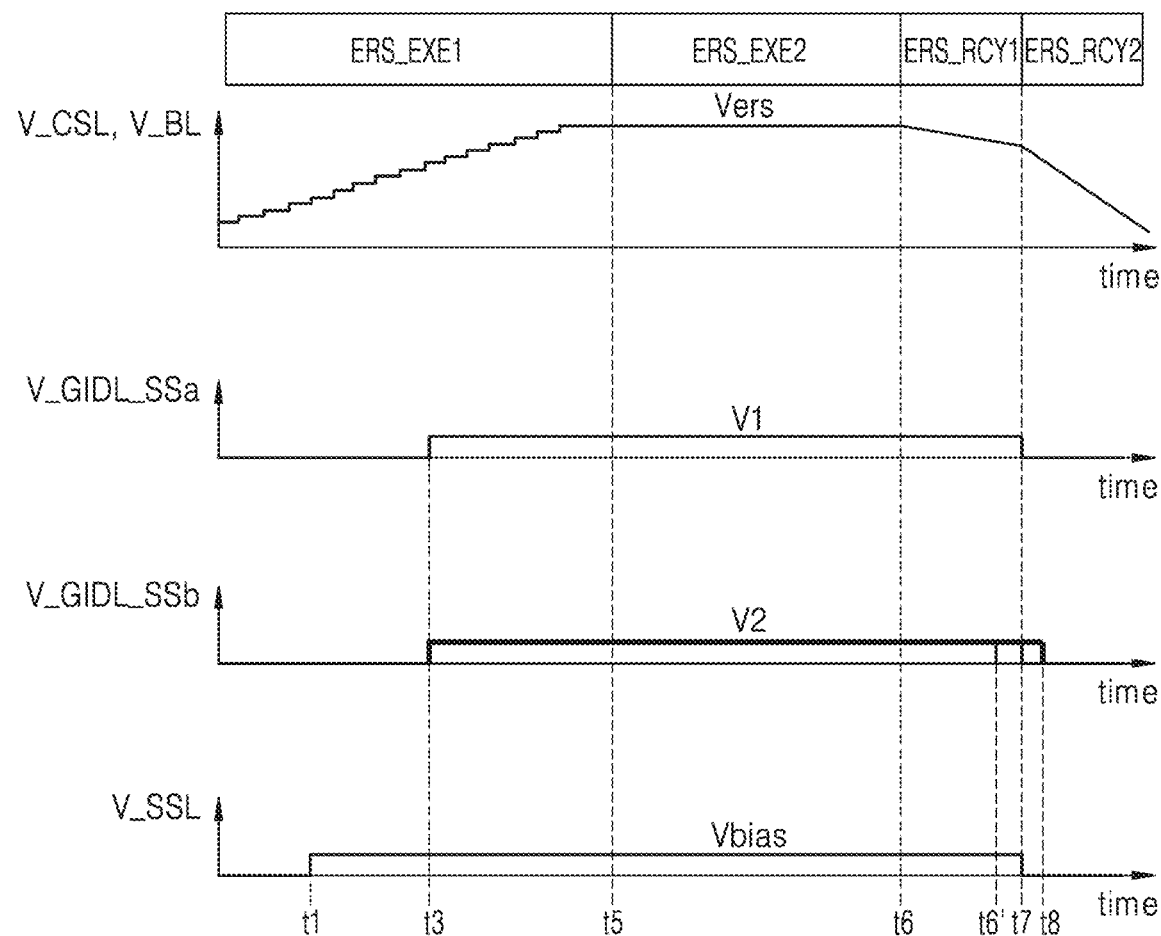

FIG. 15 is a timing diagram illustrating an erase operation of a memory device according to an embodiment.

Referring to FIG. 15, the erase operation according to the present embodiment corresponds to a modified example of the erase operation of FIG. 14, and repeated descriptions thereof are omitted. For example, the erase operation according to the present embodiment may be an erase operation on the memory block BLK of FIG. 3. During the erase operation, the application time of the first erase control voltage V_GIDL_SSa may correspond to a time period from the third time point t3 to the seventh time point t7. In other words, the application start time of the first erase control voltage V_GIDL_SSa may correspond to the third time point t3, and the application end time of the first erase control voltage V_GIDL_SSa may correspond to the seventh time point t7. In an embodiment, the application start time of the second erase control voltage V_GIDL_SSb may correspond to a time point t6' that is earlier than the seventh time point t7 or an eighth time point t8 which is later than the seventh time point t7. Accordingly, the application time of the second erase control voltage V_GIDL_SSb may be different from the application time of the first erase control voltage V_GIDL_SSa. However, inventive concepts are not limited thereto, and in some embodiments, the application time of the second erase control voltage V_GIDL_SSb may be the same as the application time of the first erase control voltage V_GIDL_SSa, and for example, the application end time of the erase control voltage V_GIDL_SSb may correspond to the seventh time point t7.

Figure 16:
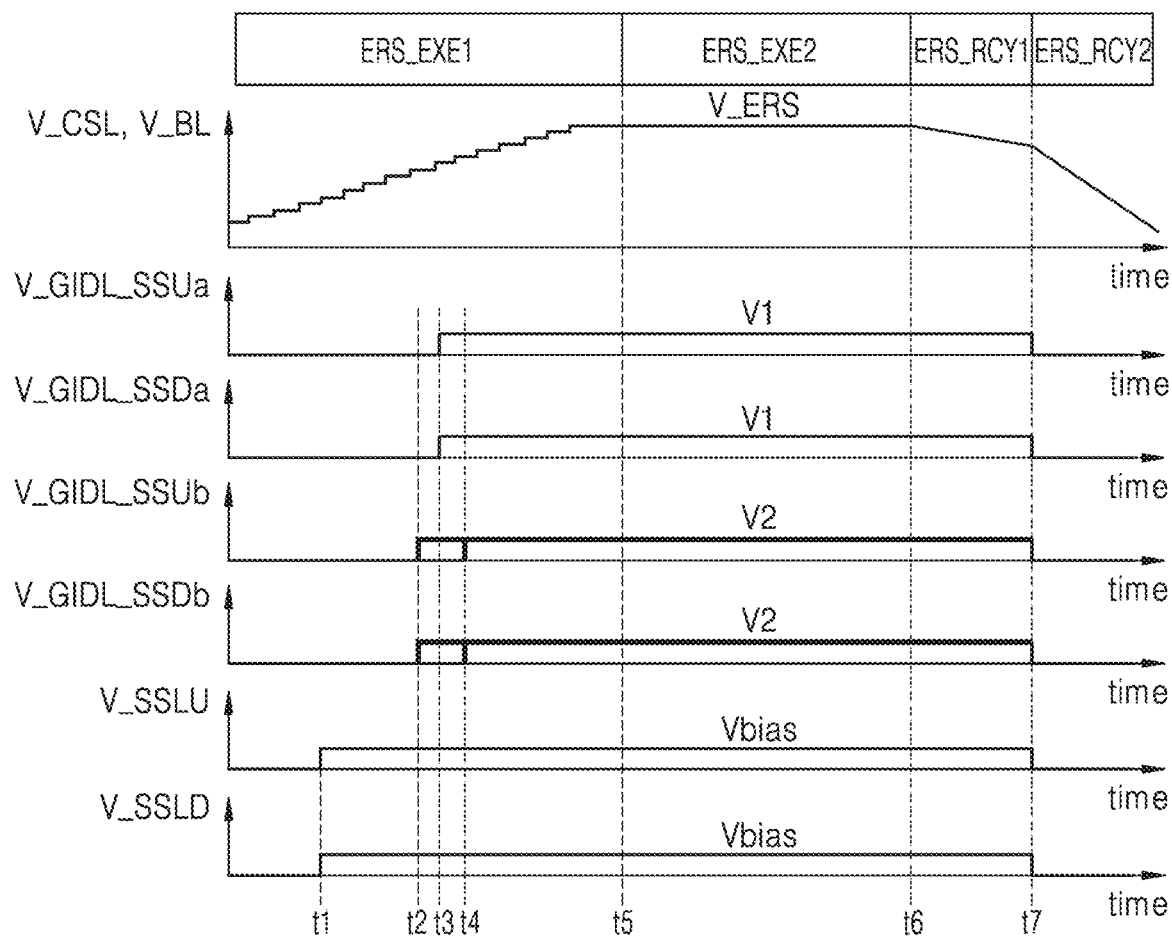

FIG. 16 is a timing diagram illustrating an erase operation of a memory device according to an embodiment.

Referring to FIG. 16, the erase operation according to the present embodiment corresponds to a modified example of the erase operation of FIG. 14, and repeated descriptions thereof are omitted. For example, the erase operation according to the present embodiment may be an erase operation on the memory block BLK' of FIG. 4. During the erase operation, a first upper erase control voltage V_GIDL_SSUa applied to upper erase control lines GIDL_SSUa of the first group may maintain the first voltage level V1, and a first lower erase control voltages V_GIDL_SSDa applied to lower erase control lines GIDL_SSDa of the first group may maintain the first voltage level V1. In addition, the first upper erase control voltage V_GIDL_SSUa may maintain the first voltage level V1 from the third time point t3 to the seventh time point t7, and the first lower erase control voltage V_GIDL_SSDa may maintain the first voltage level V1 from the third time point t3 to the seventh time point t7. As described above, voltage levels and application times of the first upper erase control voltage V_GIDL_SSUa and the first lower erase control voltage V_GIDL_SSDa may be controlled to be the same.

During the erase operation, a second upper erase control voltage V_GIDL_SSUB applied to upper erase control lines GIDL_SSUb of the second group may maintain the second voltage level V2, and a second lower erase control voltage V_GIDL_SSDb applied to lower erase control lines GIDL_SSDb of the second group may maintain the second voltage level V2. As described above, voltage levels of the second upper erase control voltage V_GIDL_SSUb and the second lower erase control voltage V_GIDL_SSDb may be controlled to be the same. In an embodiment, the first voltage level V1 may be different from the second voltage level V2. However, inventive concepts are not limited thereto, and in some embodiments, the first voltage level V1 may be the same as the second voltage level V2.

During the erase operation, application times of the first upper erase control voltage V_GIDL_SSUa and the first lower erase control voltage V_GIDL_SSDa may correspond to the time period from the third time point t3 to the seventh time period T7. In other words, application start times of the first upper erase control voltage V_GIDL_SSUa and the first lower erase control voltage V_GIDL_SSDa may corresponds to the third time t3, and application end times of the first upper erase control voltage V_GIDL_SSUa and the first lower erase control voltage V_GIDL_SSDa may correspond to the seventh time point t7. In an embodiment, application start times of the second upper erase control voltage V_GIDL_SSUb and the second lower erase control voltage V_GIDL_SSDb may correspond to the second time point t2 which is earlier than the third time point t3 or the fourth time point t4 which is later than the third time point t3. Accordingly, application times of the second upper erase control voltage V_GIDL_SSUb and the second lower erase control voltage V_GIDL_SSDb may be different from application times of the first upper erase control voltage V_GIDL_SSUa and the first lower erase control voltage V_GIDL_SSDa.

However, inventive concepts are not limited thereto, and in some embodiments, the application times of the second upper erase control voltage V_GIDL_SSUb and the second lower erase control voltage V_GIDL_SSDb may be the same as the application times of the first upper erase control voltage V_GIDL_SSUa and the first lower erase control voltage V_GIDL_SSDa, and for example, the application start times of the second upper erase control voltage V_GIDL_SSUb and the second lower erase control voltage V_GIDL_SSDb may correspond to the third time point t3.

Although not illustrated, in some embodiments, the application end times of the second upper erase control voltage V_GIDL_SSUb and the second lower erase control voltage V_GIDL_SSDb may be different from the seventh time point t7. Accordingly, the application times of the second upper erase control voltage V_GIDL_SSUb and the second lower erase control voltage V_GIDL_SSDb may be different from the application times of the first upper erase control voltage V_GIDL_SSUa and the first lower erase control voltage V_GIDL_SSDa.

Figure 17:
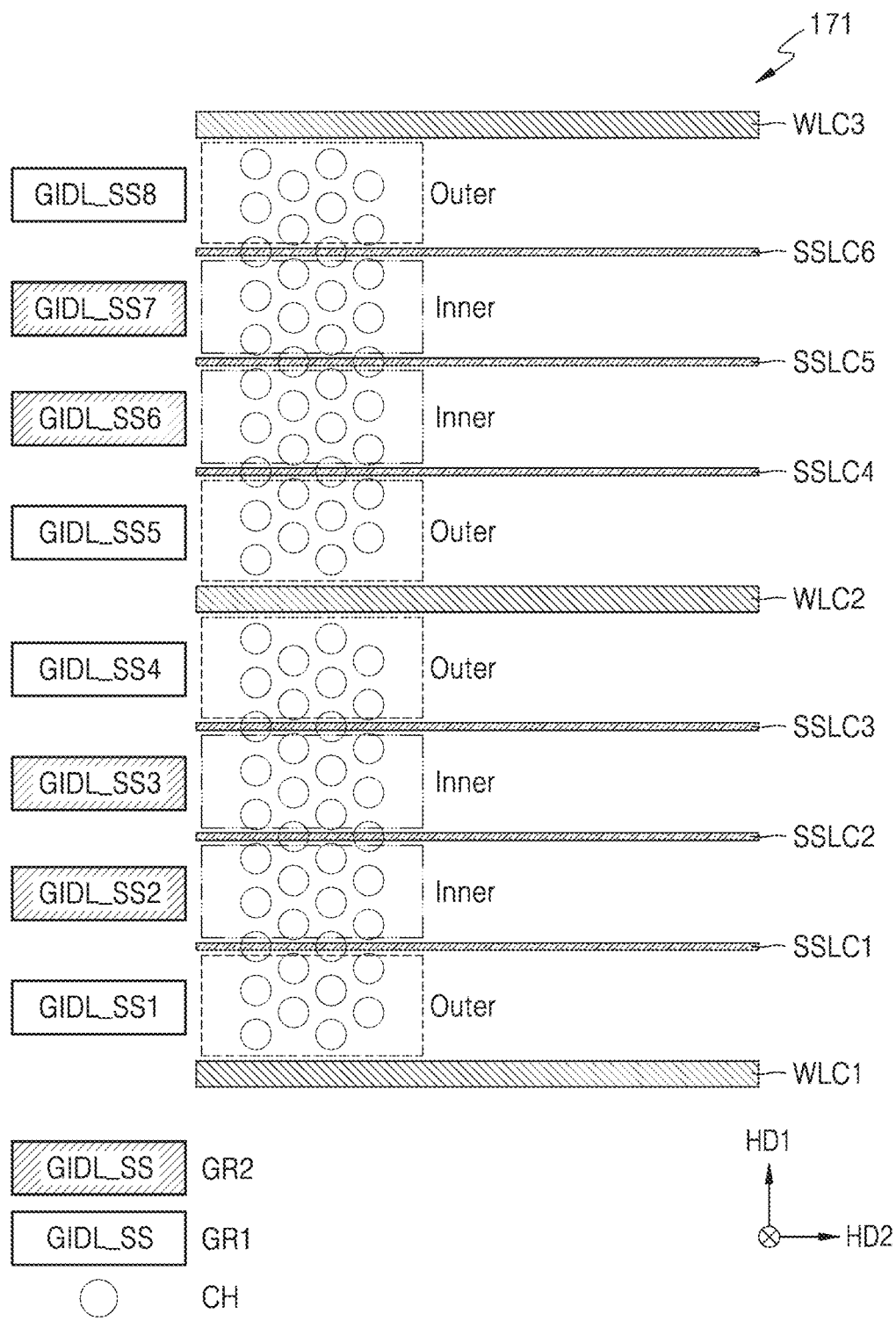
FIG. 17 is a plan view illustrating a memory device according to an embodiment.

FIG. 17 is a plan view illustrating a memory device 171 according to an embodiment.

Referring to FIG. 17, the memory device 171 corresponds to a modified example of the memory device 101 of FIG. 10, and repeated descriptions thereof are omitted. Each memory block of the memory device 171 may have an 8SSL structure including eight string select lines defined by the first to third word line cut regions WLC1 to WLC3 and first to sixth string select line cut regions SSLC1 to SSLC6. The memory device 171 may further include the first to third string select line cut regions SSLC1, SSLC2, and SSLC3 between the first and second word line cut regions WLC1 and WLC2, and the fourth to sixth string select line cut regions SSLC4, SSLC5, and SSLC6 between the second and third word line cut regions WLC2 and WLC3.

First to eighth erase control lines GIDL_SS1 to GIDL_SS8 may be arranged in regions defined by the first to third word line cut regions WLC1, WLC2, and WLC3 and the first to fourth string select line cut regions SSLC1 to SSLC4, respectively. In detail, the first erase control line GIDL_SS1 may be arranged between the first word line cut region WLC1 and the first string select line cut region SSLC1, and the second erase control line GIDL_SS2 may be arranged between the first and second string select line cut regions SSLC1 and SSLC2, and the third erase control line GIDL_SS3 may be arranged between the second and third string select line cut region SSLC2 and SSLC3, and the fourth erase control line GIDL_SS4 may be arranged between the third string select line cut region SSLC3 and the second word line cut region WLC2. Also, the fifth erase control line GIDL_SS5 may be arranged between the second word line cut region WLC2 and the fourth string select line cut region SSLC4, and the sixth erase control line GIDL_SS6 may be arranged between the fourth and fifth string select line cut regions SSLC4 and SSLC5, and the seventh erase control line GIDL_SS7 may be arranged between the fifth and sixth string select line cut regions SSLC5 and SSLC6, and the eighth erase control line GIDL_SS8 may be arranged between the sixth string select line cut region SSLC6 and the third word line cut region WLC3.

The plurality of channel holes CH may be divided into inner channel holes and outer channel holes according to a distance thereof from an adjacent word line cut region. As the channel holes CH corresponding to the first erase control line GIDL_SS1 are relatively close to the first word line cut region WLC1, they may be classified as outer channel holes; as the channel holes CH corresponding to the fourth and fifth erase control lines GIDL_SS4, GIDL_SS5 are relatively close to the second word line cut region WLC2, they may be classified as outer channel holes; and as the channel holes CH corresponding to the eighth erase control line GIDL_SS8 are relatively close to the third word line cut region WLC3, they may be classified as outer channel holes. Accordingly, the first, fourth, fifth, and eighth erase control lines GIDL_SS1, GIDL_SS4, GIDL_SS5, and GIDL_SS8 may be included in the first erase control group or the first group GR1.

As the channel holes CH corresponding to the second and third erase control line GIDL_SS2 and GIDL_SS3 are relatively far from the first word line cut region WLC1 or the second word line cut region WLC2, they may be classified as inner channel holes, and as the channel holes CH corresponding to the sixth and seventh erase control line GIDL_SS6 and GIDL_SS7 are relatively far from the second word line cut region WLC2 or from the third word line cut region WLC3, they may be classified as inner channel holes. Accordingly, the second, third, sixth, and seventh erase control lines GIDL_SS2, GIDL_SS3, GIDL_SS6, and GIDL_SS7 may be included in the second erase control group or the second group GR2.

Figure 18:
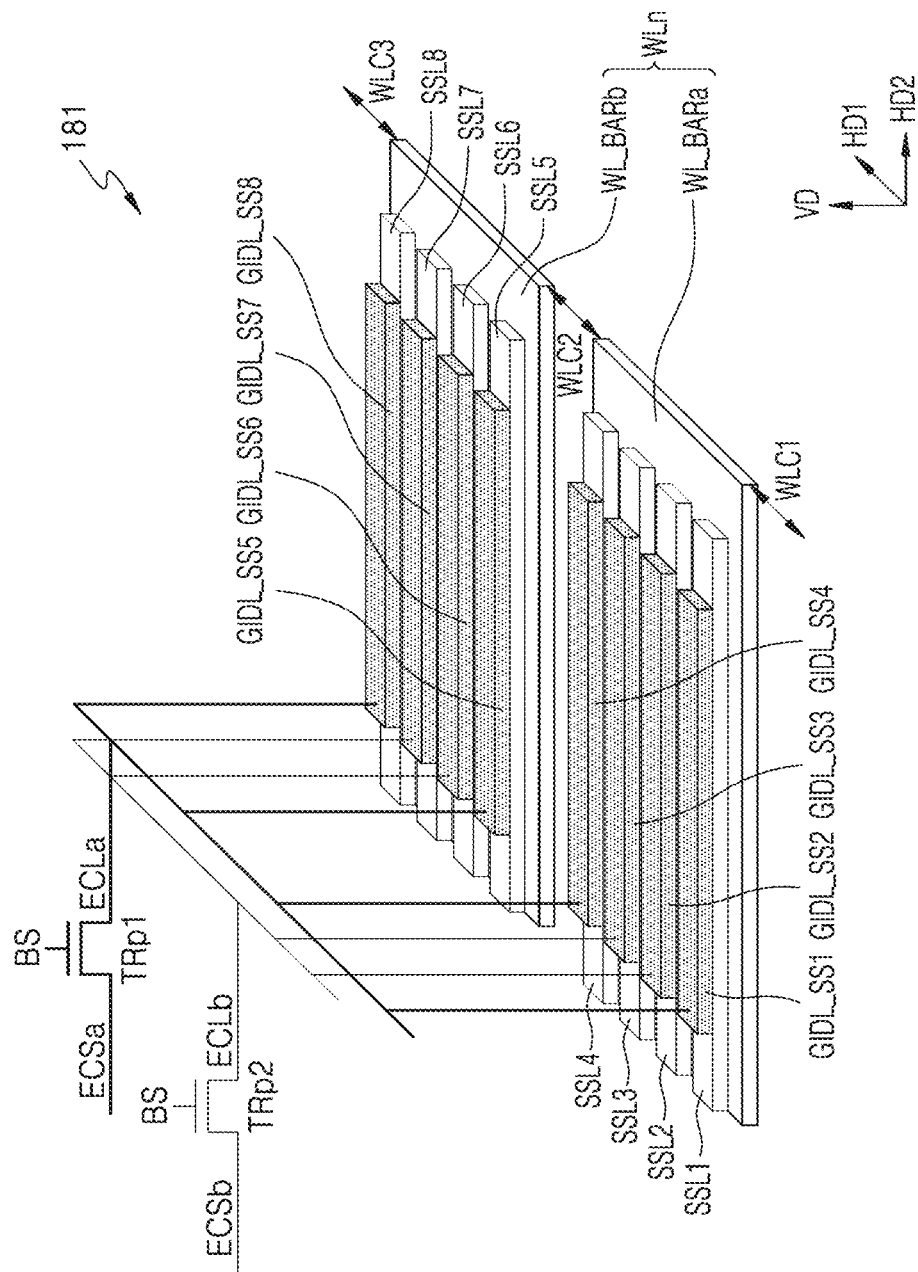
FIG. 18 illustrates a portion of a memory device according to embodiments.

FIG. 18 illustrates a portion of a memory device 181 according to an embodiment.

Referring to FIG. 18, the memory device 181 may correspond to an embodiment of the memory device 171 of FIG. 17, and the description provided above with reference to FIG. 17 may also apply to the present embodiment. Also, the memory device 181 may correspond to a modified example of the memory device 121 of FIG. 12, and repeated descriptions thereof are omitted. The first to fourth string select lines SSL1 to SSL4 may be arranged above the first word line bar WL_BARa, and the first to fourth erase control lines GIDL_SS1 to GIDL_SS4 may be respectively arranged above the first to fourth string select lines SSL1 to SSL4. The fifth to eighth select lines SSL5 to SSL8 may be arranged above the second word line bar WL_BARb, and the fifth to eighth erase control lines GIDL_SS5 to GIDL_SS8 may be arranged above the fifth to eighth select lines SSL5 to SSL8, respectively.

In an embodiment, the first, fourth, fifth, and eighth erase control lines GIDL_SS1, GIDL_SS4, GIDL_SS5, and GIDL_SS8 may be included in the first group GR1, and the second, third, sixth, and seventh erase control lines GIDL_SS2, GIDL_SS3, GIDL_SS6, and GIDL_SS7 may be included in the second group GR2. Here, the first, fourth, fifth, and eighth erase control lines GIDL_SS1, GIDL_SS4, GIDL_SS5, and GIDL_SS8 of the first group GR1 may correspond to the erase control lines GIDL_SSa of the first group of FIGS. 1 and 2, and the second, third, sixth, and seventh erase control lines GIDL_SS2, GIDL_SS3, GIDL_SS6, and GIDL_SS7 of the second group GR2 may correspond to the erase control lines GIDL_SSb of the second group of FIGS. 1 and 2. For example, the first, fourth, fifth, and eighth erase control lines GIDL_SS1, GIDL_SS4, GIDL_SS5, and GIDL_SS8 of the first group GR1 may be merged into the first erase control line ECLa, and the second, third, sixth, and seventh erase control lines GIDL_SS2, GIDL_SS3, GIDL_SS6, and GIDL_SS7 of the second group GR2 may be merged into the second erase control line ECLb, and the first erase control line ECLa and the second erase control line ECLb may be separated from each other.

Accordingly, the first pass transistor TRp1 may be connected between the first erase control line driving signal line ECSa and the first erase control line ECLa, and the first erase control line ECLa may be connected to the first, fourth, fifth, and eighth erase control lines GIDL_SS1, GIDL_SS4, GIDL_SS5, and GIDL_SS8. Also, the second pass transistor TRp2 may be connected between the second erase control line driving signal line ECSb and the second erase control line ECLb, and the second erase control line ECLb may be connected to the second, third, sixth, and seventh erase control lines GIDL_SS2, GIDL_SS3, GIDL_SS6, and GIDL_SS7.

Figure 19:
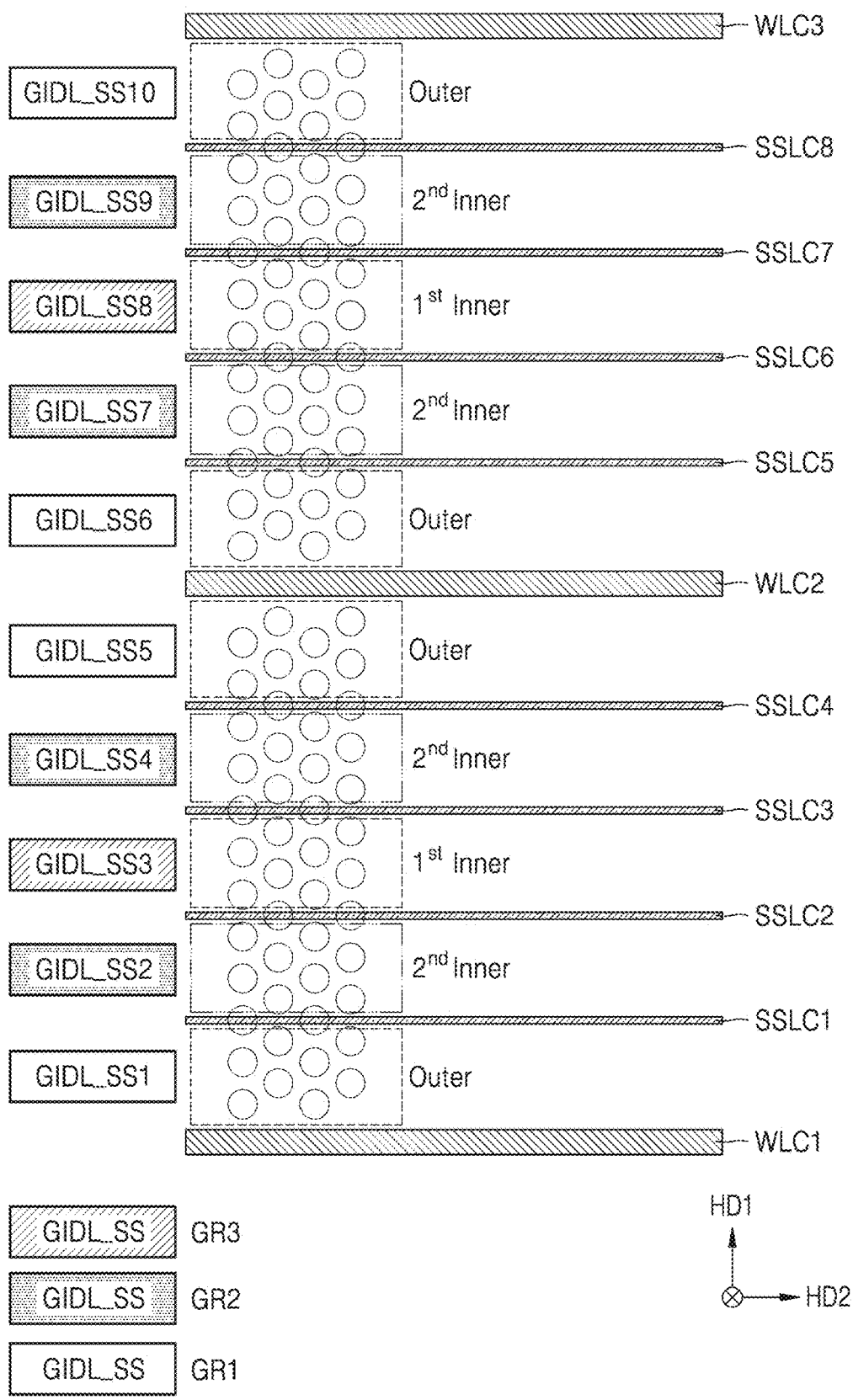
FIG. 19 is a plan view illustrating a memory device according to an embodiment.

FIG. 19 is a plan view illustrating a memory device 191 according to an embodiment.

Referring to FIG. 19, the memory device 191 corresponds to a modified example of the memory device 101 of FIG. 10, and repeated descriptions thereof are omitted. Each memory block of the memory device 191 may have a 10SSL structure including ten string select lines defined by the first to third word line cut regions WLC1 to WLC3 and first to eighth string select line cut regions SSLC1 to SSLC8. The memory device 191 may further include the first to fourth string select line cut regions SSLC1, SSLC2, SSLC3, and SSLC4 between the first and second word line cut regions WLC1 and WLC2 and the fifth to eighth string select line cut regions SSLC4, SSLC5, SSLC6, and SSLC8 between the second and third word line cut regions WLC2 and WLC3.

First to tenth erase control lines GIDL_SS1 to GIDL_SS10 may be arranged in regions defined by the first to third word line cut regions WLC1, WLC2, and WLC3 and the first to fourth string select line cut regions SSLC1 to SSLC4, respectively. In detail, the first erase control line GIDL_SS1 may be arranged between the first word line cut region WLC1 and the first string select line cut region SSLC1, and the second erase control line GIDL_SS2 may be arranged between the first and second string select line cut regions SSLC1 and SSLC2, and the third erase control line GIDL_SS3 may be arranged between the second and third string select line cut regions SSLC2 and SSLC3, and the fourth erase control line GIDL_SS4 may be arranged between the third and fourth string select line cut regions SSLC3 and SSLC4, and the fifth erase control line GIDL_SS5 may be arranged between the fourth string select line cut region SSLC4 and the second word line cut region WLC2. Also, the sixth erase control line GIDL_SS6 may be arranged between the second word line cut region WLC2 and the fifth string select line cut region SSLC5, and the seventh erase control line GIDL_SS7 may be arranged between the fifth and sixth string select line cut regions SSLC5 and SSLC6, and the eighth erase control line GIDL_SS8 may be arranged between the sixth and seventh string select line cut regions SSLC6 and SSLC7, and the ninth erase control line GIDL_SS9 may be arranged between the seventh and eighth string select line cut regions SSLC7 and SSLC8, and the tenth erase control line GIDL_SS10 may be arranged between the eighth string select line cut region SSLC8 and the third word line cut region WLC3.

The plurality of channel holes CH may be divided into inner channel holes and outer channel holes according to a distance thereof from an adjacent word line cut region. As the channel holes CH corresponding to the first erase control line GIDL_SS1 are relatively close to the first word line cut region WLC1, they may be classified as outer channel holes; as the channel holes CH corresponding to the fifth and sixth erase control lines GIDL_SS5, GIDL_SS6 are relatively close to the second word line cut region WLC2, they may be classified as outer channel holes; and as the channel holes CH corresponding to the tenth erase control line GIDL_SS10 are relatively close to the third word line cut region WLC3, they may be classified as outer channel holes. Accordingly, the first, fifth, sixth, and tenth erase control lines GIDL_SS1, GIDL_SS5, GIDL_SS6, and GIDL_SS10 may be included in the first erase control group or the first group GR1.

As the channel holes CH corresponding to the second erase control line GIDL_SS2 are relatively far from the first word line cut region WLC1, they may be classified as second inner channel holes; as the channel holes CH corresponding to the fourth and seventh erase control lines GIDL_SS4, GIDL_SS7 are relatively far from the second word line cut region WLC2, they may be classified as second inner channel holes; and as the channel holes CH corresponding to the ninth erase control line GIDL_SS9 are relatively far from the third word line cut region WLC3, they may be classified as second inner channel holes. Accordingly, the second, fourth, seventh, and ninth erase control lines GIDL_SS2, GIDL_SS4, GIDL_SS7, and GIDL_SS9 may be included in the second erase control group or the second group GR2.

As the channel holes CH corresponding to the third erase control line GIDL_SS3 are farthest from the first word line cut region WLC1 or the second word line cut region WLC2, they may be classified as first inner channel holes, and as the channel holes CH corresponding to the eighth erase control line GIDL_SS8 are farthest from the second word line cut region WLC2 or from the third word line cut region WLC3, they may be classified as first inner channel holes. Accordingly, the third and eighth erase control lines GIDL_SS3 and GIDL_SS8 may be included in a third erase control group or a third group GR3.

Figure 20:
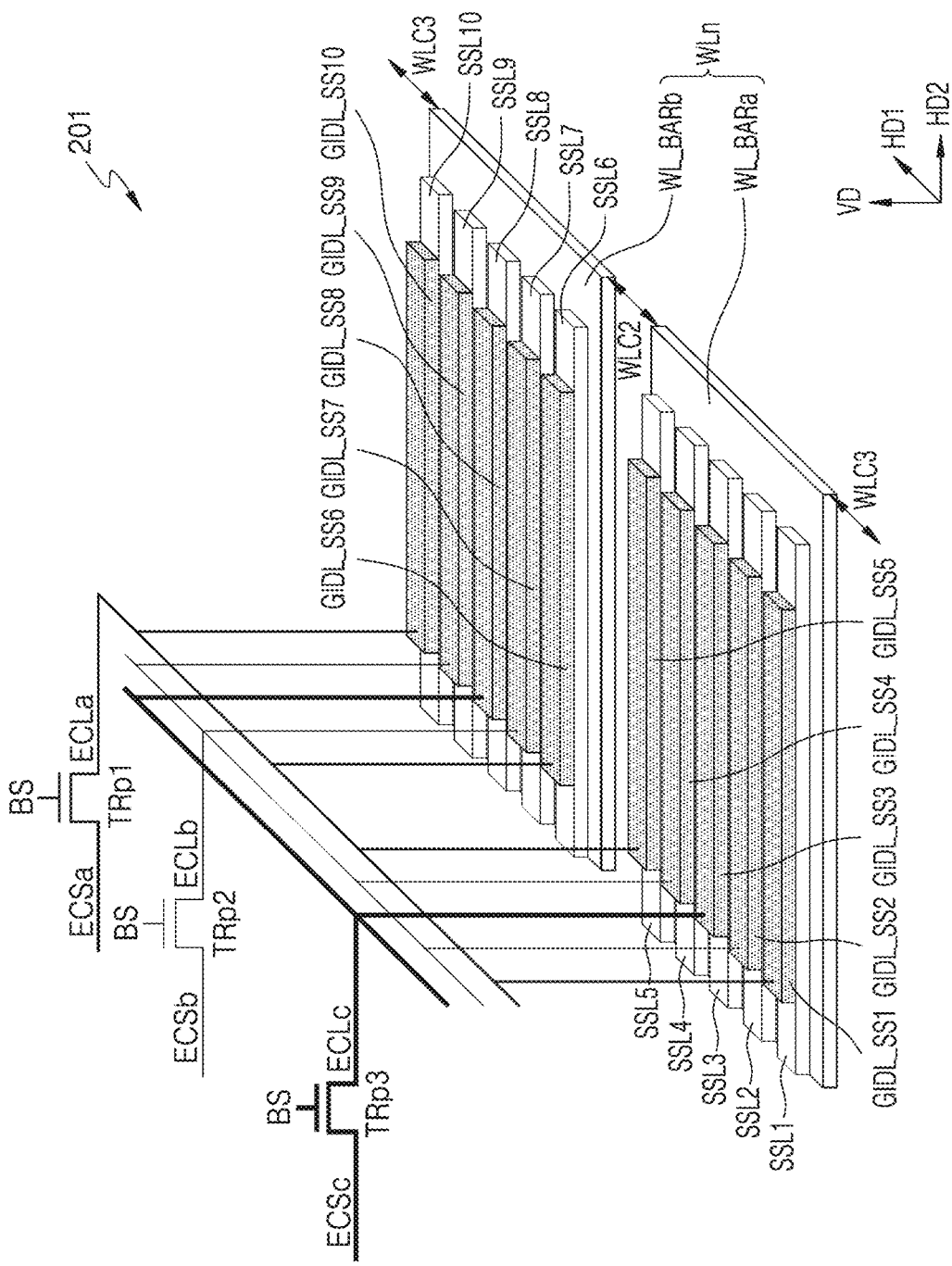
FIG. 20 illustrates a portion of a memory device according to embodiments.

FIG. 20 illustrates a portion of a memory device 201 according to an embodiment.

Referring to FIG. 20, the memory device 201 may correspond to an embodiment of the memory device 191 of FIG. 19, and the description provided above with reference to FIG. 19 may also apply to the present embodiment. Also, the memory device 201 may correspond to a modified example of the memory device 121 of FIG. 12, and repeated descriptions thereof are omitted. The first to fifth string select lines SSL1 to SSL5 may be arranged above the first word line bar WL_BARa, and the first to fifth erase control lines GIDL_SS1 to GIDL_SS5 may be respectively arranged above the first to fifth string select lines SSL1 to SSL5. The sixth to tenth select lines SSL6 to SSL10 may be arranged above the second word line bar WL_BARb, and the sixth to tenth erase control lines GIDL_SS6 to GIDL_SS10 may be arranged above the sixth to tenth select lines SSL6 to SSL10, respectively.

The first, fifth, sixth, and tenth erase control lines GIDL_SS1, GIDL_SS5, GIDL_SS6, and GIDL_SS10 may be included in the first group GR1 and may correspond to the erase control lines GIDL_SSa of the first group of FIGS. 1 and 2. The first, fifth, sixth, and tenth erase control lines GIDL_SS1, GIDL_SS5, GIDL_SS6, and GIDL_SS10 of the first group GR1 may be merged into the first erase control line ECLa. The first pass transistor TRp1 may be connected between the first erase control line driving signal line ECSa and the first erase control line ECLa.

The second, fourth, seventh, and ninth erase control lines GIDL_SS2, GIDL_SS4, GIDL_SS7, and GIDL_SS9 may be included in the second group GR2 and correspond to the second erase control lines GIDL_SSb of the second group of FIGS. 1 and 2. The second, fourth, seventh, and ninth erase control lines GIDL_SS2, GIDL_SS4, GIDL_SS7, and GIDL_SS9 may be merged into the second erase control line ECLb. The second pass transistor TRp2 may be connected between the second erase control line driving signal line ECSb and the second erase control line ECLb.

The third and eighth erase control lines GIDL_SS3 and GIDL_SS8 may be included in the third group GR3, and the third and eighth erase control lines GIDL_SS3 and GIDL_SS8 of the third group GR may be merged into a third erase control line ECLc. The third pass transistor TRp3 may be connected between the third erase control line driving signal line ECSs and the third erase control lines ECLs.

Figure 21:
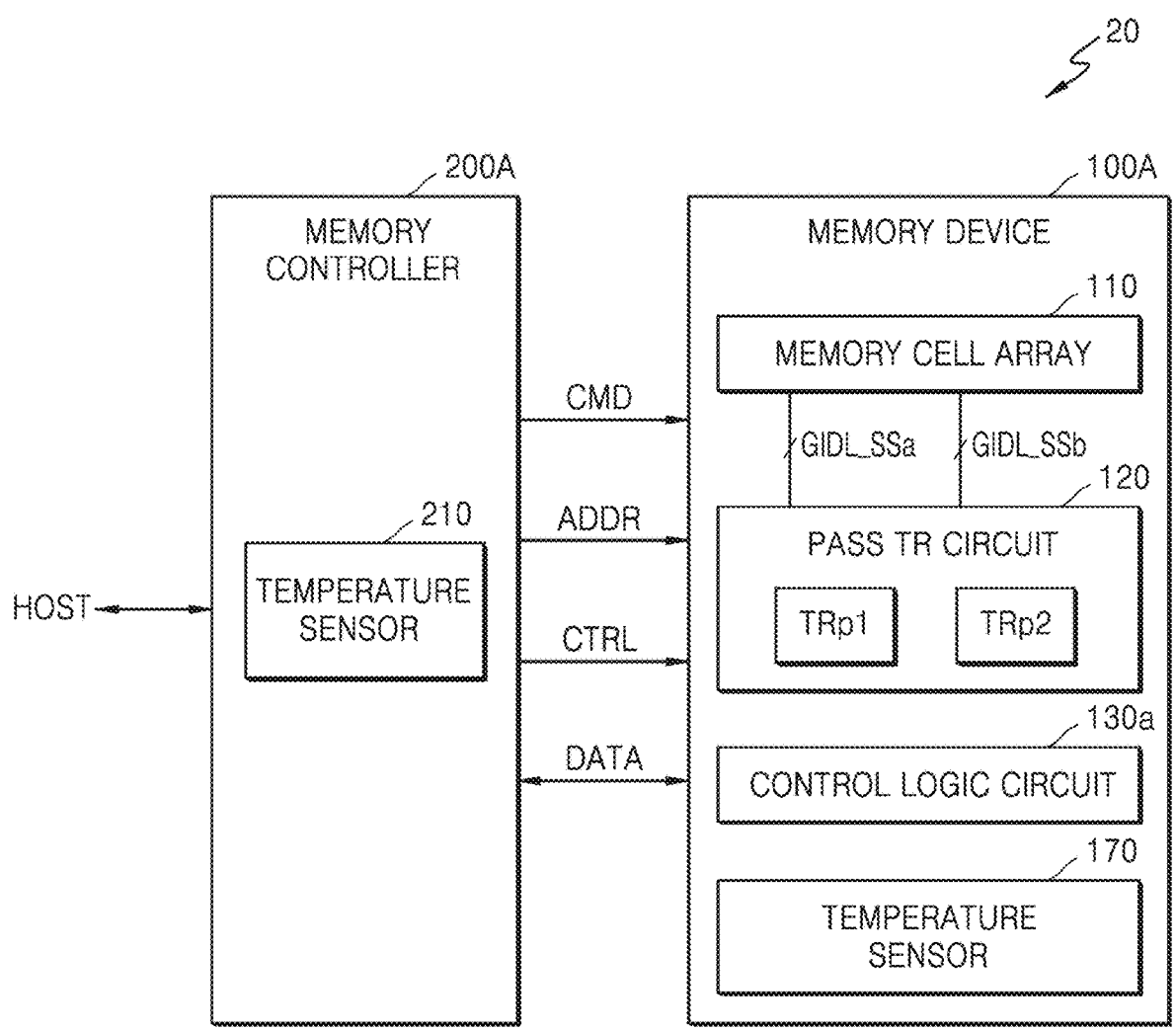
FIG. 21 is a block diagram illustrating a memory system according to an embodiment.

FIG. 21 is a block diagram illustrating a memory system 20 according to an embodiment.

Referring to FIG. 21, the memory system 20 may include a memory device 100A and a memory controller 200A, and the memory device 100A may include the memory cell array 110, the pass transistor circuit 120, a control logic circuit 130a, and a temperature sensor 170. In an embodiment, the memory controller 200A may include a temperature sensor 210. In an embodiment, the memory system 20 may include only one of the temperature sensor 170 and the temperature sensor 210. The memory system 20 according to the present embodiment corresponds to a modified example of the memory system 10 of FIG. 1, and the description provided above with reference to FIGS. 1 to 20 may also apply to the present embodiment.

At least one of the temperature sensor 170 and the temperature sensor 210 may generate temperature information by sensing a temperature of the memory device 100A. The control logic circuit 130a may receive temperature information from at least one of the temperature sensor 170 and the temperature sensor 210. For example, the temperature sensor 170 may provide information to the control logic circuit 130a. For example, the memory controller 200A may provide a control signal CTRL or data DATA based on the temperature information generated by the temperature sensor 210.

The control logic circuit 130a may control, based on the temperature information, compensation values of voltage levels and application times of each of the first erase control voltage provided to the first pass transistor TRp1 and the second erase control voltage provided to the second pass transistor TRp2. In an embodiment, a compensation value with respect to the voltage level of the first erase control voltage may be different from a compensation value with respect to the voltage level of the second erase control voltage. In an embodiment, a compensation value with respect to the application time of the first erase control voltage may be different from a compensation value with respect to the application time of the second erase control voltage.

Figure 22:
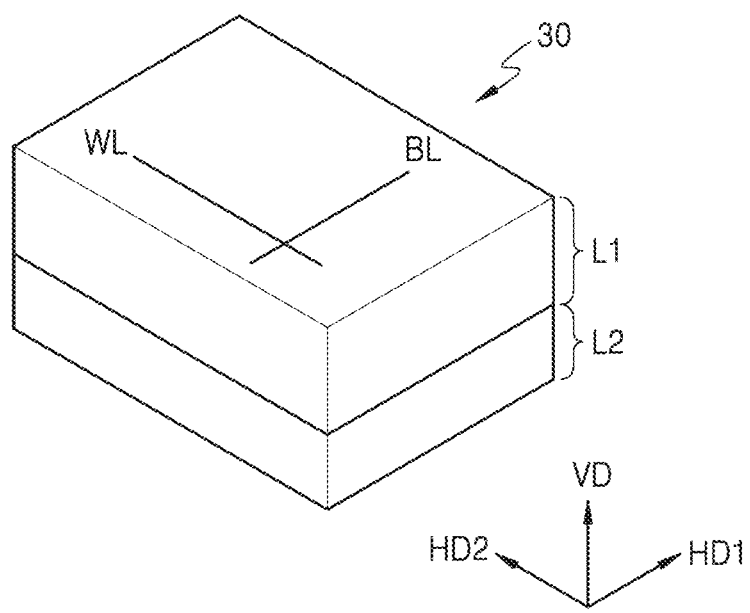
FIG. 22 illustrates a memory device having a cell over peri (COP) structure, according to an embodiment.

FIG. 22 illustrates a memory device 30 having a cell over peri (COP) structure, according to an embodiment.

Referring to both FIGS. 2 and 22, the memory device 30 may include a first semiconductor layer L1 and a second semiconductor layer L2, and the first semiconductor layer L1 may be stacked with respect to the second semiconductor layer L2 in the vertical direction VD. In detail, the second semiconductor layer L2 may be arranged below the first semiconductor layer L1 in the vertical direction VD. The memory device 100 of FIG. 1 and/or the memory device 100A of FIG. 21 may have a COP structure like the memory device 30.

In an embodiment, the memory cell array 110 and the pass transistor circuit 120 may be formed in the first semiconductor layer L1, and the control logic circuit 130, the row decoder 140, the voltage generator 150, and the page buffer circuit 160 may be formed in the second semiconductor layer L2. In an embodiment, the memory cell array 110 may be formed in the first semiconductor layer L1, and the pass transistor circuit 120, the control logic circuit 130, the row decoder 140, the voltage generator 150, and the page buffer circuit 160 may be formed in the second semiconductor layer L2. Accordingly, the memory device 10 may have a structure in which the memory cell array 110 is arranged above some peripheral circuits, that is, a COP structure. The COP structure may effectively reduce a horizontal area and improve the degree of integration of the memory device 30.

In an embodiment, the second semiconductor layer L2 may include a substrate, and circuits may be formed in the second semiconductor layer L2 by forming, on the substrate, semiconductor devices such as transistors and a pattern for wiring the devices. After the circuits are formed in the second semiconductor layer L2, the first semiconductor layer L1 including the memory cell array 110 may be formed, and patterns for electrically connecting the word lines WL and the bit lines BL of the memory cell array 110 to the circuits formed in the second semiconductor layer L2 may be formed.

Figure 23:
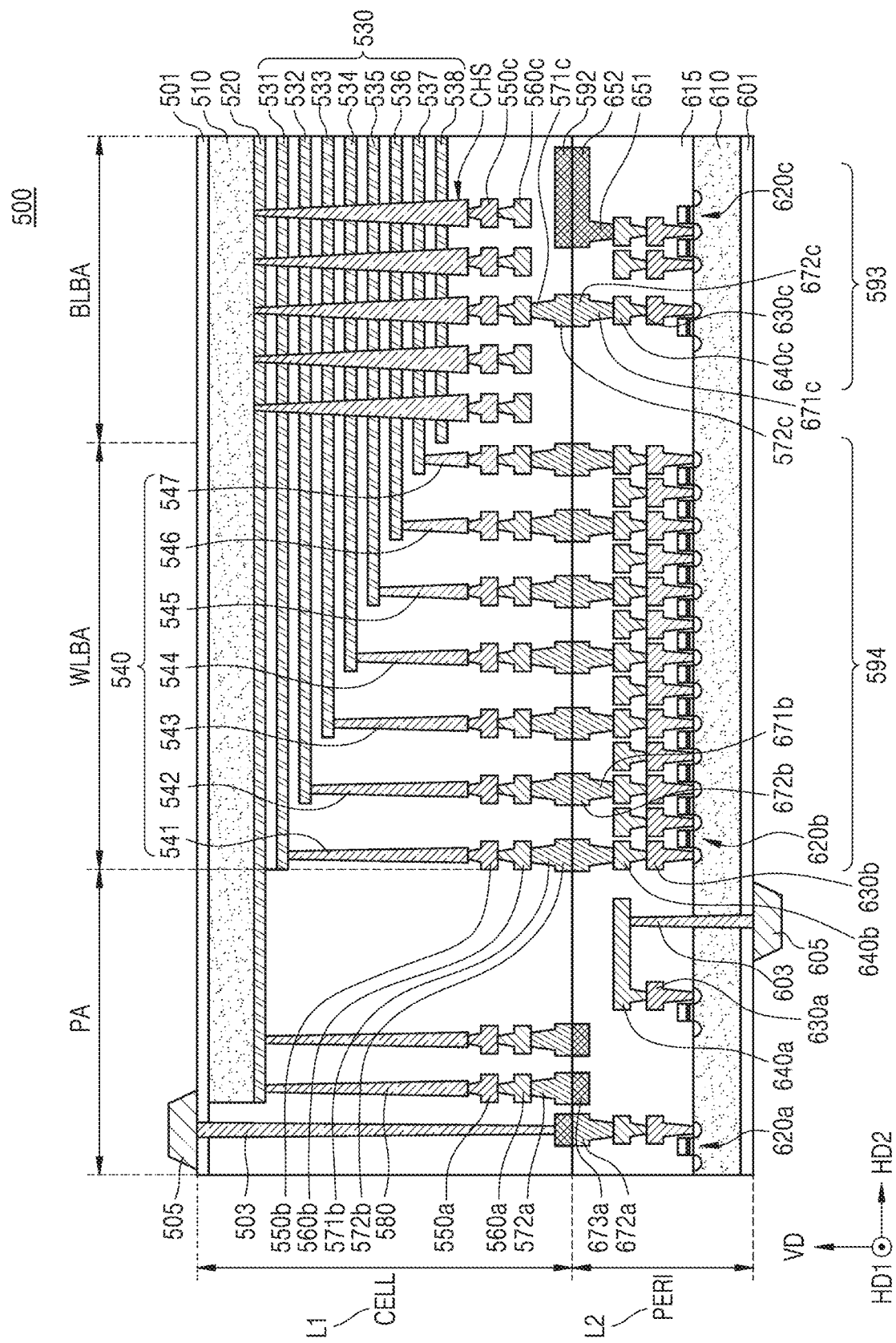
FIG. 23 is a cross-sectional view of a memory device having a bonding vertical NAND (B-VNAND) structure, according to an embodiment.

FIG. 23 is a cross-sectional view of a memory device 500 having a bonding vertical NAND (B-VNAND) structure, according to an embodiment. When a non-volatile memory included in a memory device is implemented as a B-VNAND type flash memory, the non-volatile memory may have the structure illustrated in FIG. 23.

Referring to FIG. 23, a cell region CELL of the memory device 500 may correspond to the first semiconductor layer L1, and a peripheral circuit region PERI may correspond to the second semiconductor layer L2. Each of the peripheral circuit region PERI and the cell region CELL of the memory device 500 may include an external pad bonding area PA, a word line bonding area WLBA, and a bit line bonding area BLBA. For example, the plurality of word lines WL, the plurality of string select lines SSL, the plurality of ground select lines GSL, the first and second erase control lines GIDL_SSa and GIDL_SSb, and the memory cell array 110 of FIG. 2 may be formed in the first semiconductor layer L1, and the pass transistor circuit 120, the control logic circuit 130, the row decoder 140, the voltage generator 150, and the page buffer circuit 160 of FIG. 2 may be formed in the second semiconductor layer L2. For example, the plurality of word lines WL, the plurality of string select lines SSL, the plurality of ground select lines GSL, the first and second erase control lines GIDL_SSa and GIDL_SSb, the memory cell array 110, and the pass transistor circuit 120 of FIG. 2 may be formed in the first semiconductor layer L1, and the control logic circuit 130, the row decoder 140, the voltage generator 150, and the page buffer circuit 160 of FIG. 2 may be formed in the second semiconductor layer L2.

The peripheral circuit region PERI may include a first substrate 610, an interlayer insulating layer 615, a plurality of circuit elements 620a, 620b, and 620c formed on the first substrate 610, first metal layers 630a, 630b, and 630c respectively connected to the plurality of circuit elements 620a, 620b, and 620c, and second metal layers 640a, 640b, and 640c respectively formed on the first metal layers 630a, 630b, and 630c. In an example embodiment, the first metal layers 630a, 630b, and 630c may be formed of tungsten having relatively high resistivity, and the second metal layers 640a, 640b, and 640c may be formed of copper having relatively low resistivity.

In an example embodiment, although only the first metal layers 630a, 630b, and 630c and the second metal layers 640a, 640b, and 640c are shown and described, the example embodiment is not limited thereto, and one or more additional metal layers may be further formed on the second metal layers 640a, 640b, and 640c. At least some of the one or more additional metal layers formed on the second metal layers 640a, 640b, and 640c may be formed of aluminum or the like having a lower resistivity than those of copper forming the second metal layers 640a, 640b, and 640c.

The interlayer insulating layer 615 may be arranged on the first substrate 610 and cover the plurality of circuit elements 620a, 620b, and 620c, the first metal layers 630a, 630b, and 630c, and the second metal layers 640a, 640b, and 640c. The interlayer insulating layer 615 may include an insulating material such as silicon oxide, silicon nitride, or the like.

Lower bonding metals 671b and 672b may be formed on the second metal layer 640b in the word line bonding area WLBA. In the word line bonding area WLBA, the lower bonding metals 671b and 672b in the peripheral circuit region PERI may be electrically bonded to upper bonding metals 571b and 572b of the cell region CELL. The lower bonding metals 671b and 672b and the upper bonding metals 571b and 572b may be formed of aluminum, copper, tungsten, or the like. Furthermore, the upper bonding metals 571b and 572b in the cell region CELL may be referred as first metal pads and the lower bonding metals 671b and 672b in the peripheral circuit region PERI may be referred as second metal pads.

The cell region CELL may include at least one memory block. The cell region CELL may include a second substrate 510 and a common source line 520. On the second substrate 510, a plurality of word lines 531 to 538 (i.e., 530) may be stacked in a vertical direction VD, perpendicular to an upper surface of the second substrate 510. At least one string select line and at least one ground select line may be arranged on and below the plurality of word lines 530, respectively, and the plurality of word lines 530 may be disposed between the at least one string select line and the at least one ground select line.

In the bit line bonding area BLBA, a channel structure CHS may extend in the vertical direction VD, perpendicular to the upper surface of the second substrate 510, and pass through the plurality of word lines 530, the at least one string select line, and the at least one ground select line. The channel structure CHS may include a data storage layer, a channel layer, a buried insulating layer, and the like, and the channel layer may be electrically connected to a first metal layer 550c and a second metal layer 560c. For example, the first metal layer 550c may be a bit line contact, and the second metal layer 560c may be a bit line. In an example embodiment, the second metal layer 560c, that is, the bit line 560c may extend in a second horizontal direction HD2, parallel to the upper surface of the second substrate 510.

In an example embodiment, an area in which the channel structure CH, the bit line 560c, and the like are disposed may be defined as the bit line bonding area BLBA. In the bit line bonding area BLBA, the bit line 560c may be electrically connected to the circuit elements 620c providing a page buffer 593 in the peripheral circuit region PERI. The bit line 560c may be connected to upper bonding metals 571c and 572c in the cell region CELL, and the upper bonding metals 571c and 572c may be connected to lower bonding metals 671c and 672c connected to the circuit elements 620c of the page buffer 593.

In the word line bonding area WLBA, the plurality of word lines 530 may extend in a first horizontal direction HD1, parallel to the upper surface of the second substrate 510, and may be connected to a plurality of cell contact plugs 541 to 547 (i.e., 540). The plurality of word lines 530 and the plurality of cell contact plugs 540 may be connected to each other in pads provided by at least some of the plurality of word lines 530 extending in different lengths in the second horizontal direction HD2. A first metal layer 550b and a second metal layer 560b may be connected to an upper portion of the plurality of cell contact plugs 540 connected to the plurality of word lines 530, sequentially. The plurality of cell contact plugs 540 may be connected to the peripheral circuit region PERI by the upper bonding metals 571b and 572b of the cell region CELL and the lower bonding metals 671b and 672b of the peripheral circuit region PERI in the word line bonding area WLBA.

The plurality of cell contact plugs 540 may be electrically connected to the circuit elements 620b providing a row decoder 594 in the peripheral circuit region PERI. In an example embodiment, operating voltages of the circuit elements 620b of the row decoder 594 may be different than operating voltages of the circuit elements 620c providing the page buffer 593. For example, operating voltages of the circuit elements 620c providing the page buffer 593 may be greater than operating voltages of the circuit elements 620b providing the row decoder 594.

A common source line contact plug 580 may be disposed in the external pad bonding area PA. The common source line contact plug 580 may be formed of a conductive material such as a metal, a metal compound, polysilicon, or the like, and may be electrically connected to the common source line 520. A first metal layer 550a and a second metal layer 560a may be stacked on an upper portion of the common source line contact plug 580, sequentially. For example, an area in which the common source line contact plug 580, the first metal layer 550a, and the second metal layer 560a are disposed may be defined as the external pad bonding area PA.

First and second input-output pads 605 and 505 may be disposed in the external pad bonding area PA. A lower insulating film 601 covering a lower surface of the first substrate 610 may be formed below the first substrate 610, and the first input-output pad 605 may be formed on the lower insulating film 601. The first input-output pad 605 may be connected to at least one of the plurality of circuit elements 620a, 620b, and 620c disposed in the peripheral circuit region PERI through a first input-output contact plug 603, and may be separated from the first substrate 610 by the lower insulating film 601. In addition, a side insulating film may be disposed between the first input-output contact plug 603 and the first substrate 610 to electrically separate the first input-output contact plug 603 and the first substrate 610.

An upper insulating film 501 covering the upper surface of the second substrate 510 may be formed on the second substrate 510, and the second input-output pad 505 may be disposed on the upper insulating layer 501. The second input-output pad 505 may be connected to at least one of the plurality of circuit elements 620a, 620b, and 620c disposed in the peripheral circuit region PERI through a second input-output contact plug 503.

According to embodiments, the second substrate 510 and the common source line 520 may not be disposed in an area in which the second input-output contact plug 503 is disposed. Also, the second input-output pad 505 may not overlap the word lines 530 in the vertical direction VD. The second input-output contact plug 503 may be separated from the second substrate 510 in a direction, parallel to the upper surface of the second substrate 510, and may pass through an interlayer insulating layer of the cell region CELL to be connected to the second input-output pad 505.

According to embodiments, the first input-output pad 605 and the second input-output pad 505 may be selectively formed. For example, the memory device 500 may include only the first input-output pad 605 disposed on the first substrate 610 or the second input-output pad 505 disposed on the second substrate 510. Alternatively, the memory device 500 may include both the first input-output pad 605 and the second input-output pad 505.

A metal pattern provided on an uppermost metal layer may be provided as a dummy pattern or the uppermost metal layer may be absent, in each of the external pad bonding area PA and the bit line bonding area BLBA respectively included in the cell region CELL and the peripheral circuit region PERI.

In the external pad bonding area PA, the memory device 500 may include a lower metal pattern 673a, corresponding to an upper metal pattern 572a formed in an uppermost metal layer of the cell region CELL, and having the same cross-sectional shape as the upper metal pattern 572a of the cell region CELL so as to be connected to each other, in an uppermost metal layer of the peripheral circuit region PERI. In the peripheral circuit region PERI, the lower metal pattern 673a formed in the uppermost metal layer of the peripheral circuit region PERI may not be connected to a contact. Similarly, in the external pad bonding area PA, an upper metal pattern, corresponding to the lower metal pattern formed in an uppermost metal layer of the peripheral circuit region PERI and having the same shape as the lower metal pattern of the peripheral circuit region PERI, may be formed in an uppermost metal layer of the cell region CELL.

The lower bonding metals 671b and 672b may be formed on the second metal layer 640b in the word line bonding area WLBA. In the word line bonding area WLBA, the lower bonding metals 671b and 672b of the peripheral circuit region PERI may be electrically connected to the upper bonding metals 571b and 572b of the cell region CELL by Cu-to-Cu bonding.

Furthermore, in the bit line bonding area BLBA, an upper metal pattern 592, corresponding to a lower metal pattern 652 formed in the uppermost metal layer of the peripheral circuit region PERI and having the same cross-sectional shape as the lower metal pattern 652, may be formed in an uppermost metal layer of the cell region CELL. A contact may not be formed on the upper metal pattern 592 formed in the uppermost metal layer of the cell region CELL.

Figure 24:
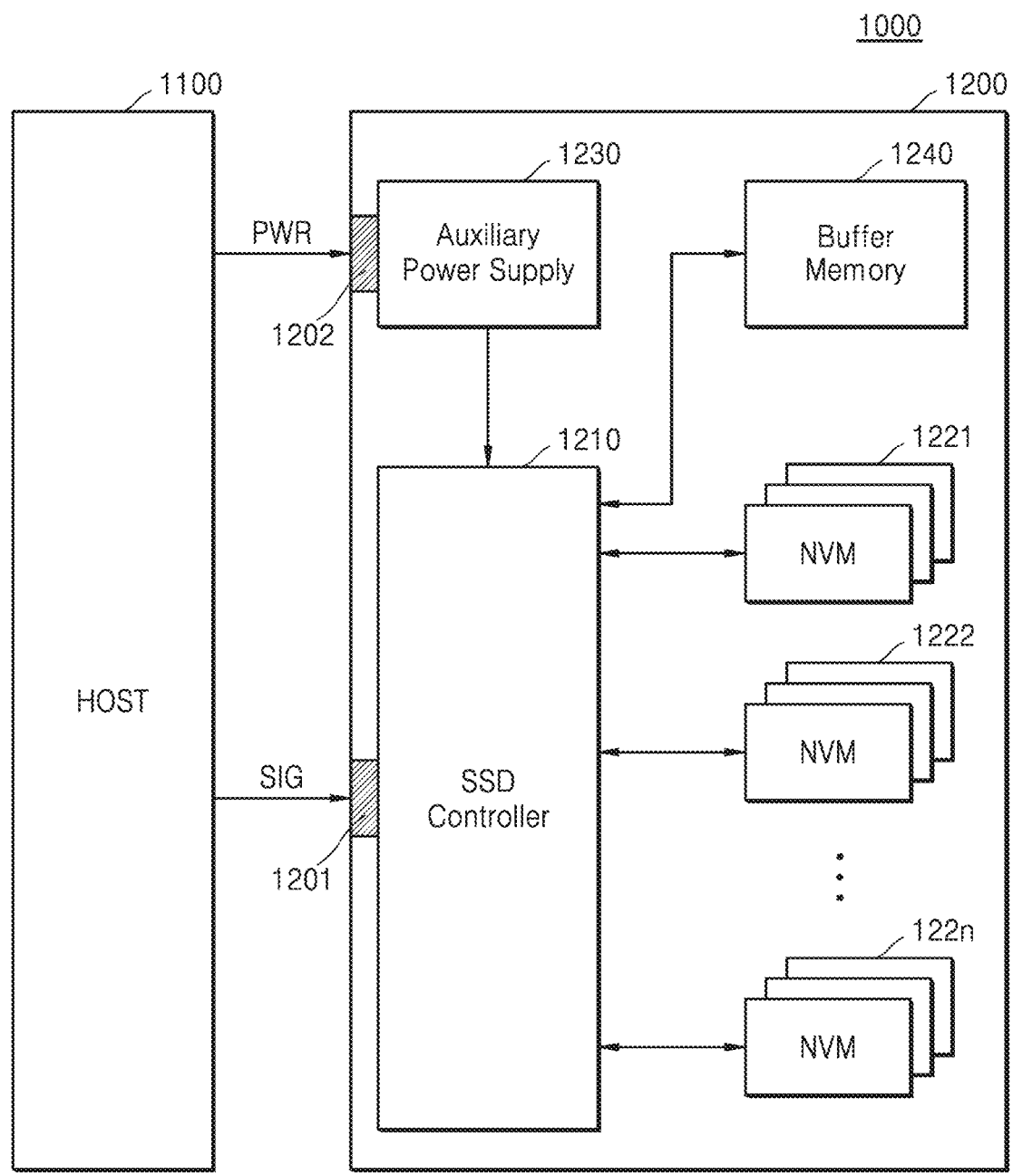
FIG. 24 is a block diagram illustrating a solid state drive (SSD) system, to which a memory device according to an embodiment is applied.

FIG. 24 is a block diagram illustrating a solid state drive (SSD) system, to which a memory device according to an embodiment is applied.

Referring to FIG. 24, the SSD system 1000 may include a host 1100 and an SSD 1200. The SSD 1200 transmits and receives signals to and from the host 1100 through a signal connector 1201, and receives power through a power connector 1202. The SSD 1200 may include an SSD controller 1210, an auxiliary power supply 1230, and memory devices 1221, 1222, and 122n. The memory devices 1221, 1222, and 122n may be vertically stacked NAND flash memory devices. The SSD 1200 may be implemented using the embodiments described above with reference to FIGS. 1 to 23.

One or more of the elements disclosed above may include or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

While inventive concepts have been particularly shown and described with reference to embodiments thereof, it will be understood that various changes in form and details may be made therein without departing from the spirit and scope of the following claims.

What is claimed is:

1. A non-volatile memory device comprising:
a plurality of word lines stacked above a substrate in a vertical direction, the plurality of word lines including a word line cut region;
a plurality of erase control lines spaced apart from each other in a first direction and extending in a second direction orthogonal to the first direction, wherein a first group of the plurality of erase control lines are relatively close to the word line cut region compared to a second group of the plurality of erase control lines that is relatively far from the word line cut region;
a pass transistor circuit comprising a first pass transistor and a second pass transistor, the first pass transistor being connected to the first group of the plurality of erase control lines, and the second pass transistor being connected to the second group of the plurality of erase control lines; and
a memory cell array including a plurality of blocks,
each block among the plurality of blocks including a plurality of channel structures connected to the plurality of word lines and the plurality of erase control lines, and
each of the plurality of channel structures extending in the vertical direction.

2. The non-volatile memory device of claim 1, further comprising:
a plurality of string select lines that are spaced apart from each other in the first direction and extend in the second direction, respectively, above the plurality of word lines,
wherein the plurality of erase control lines are above the plurality of string select lines.

3. The non-volatile memory device of claim 1, further comprising:
a plurality of ground select lines that are spaced apart from each other in the first direction and extend in the second direction, respectively, below the plurality of word lines,
wherein the plurality of erase control lines are under the plurality of ground select lines.

4. The non-volatile memory device of claim 1, wherein the plurality of erase control lines comprise a plurality of gate induced drain leakage (GIDL) gate lines, and
each of the plurality of channel structures comprises GIDL select transistors connected to corresponding GIDL gate lines from among the plurality of GIDL gate lines.

5. The non-volatile memory device of claim 1, wherein the non-volatile memory device is configured to perform an erase operation on a selected block among the plurality of blocks,
the erase operation includes applying a first erase control voltage to the first group of the plurality of erase control lines and a second erase control voltage to the second group of the plurality of erase control lines, and
the first erase control voltage is different than the second erase control voltage.

6. The non-volatile memory device of claim 1, wherein the non-volatile memory device is configured to perform an erase operation on a selected block among the plurality of blocks, and
the erase operation includes an application start time for applying a first erase control voltage to the first group of the plurality of erase control lines that is different compared to an application start time for applying a second erase control voltage to the second group of the plurality of erase control lines.

7. The non-volatile memory device of claim 1, wherein the non-volatile memory device is configured to perform an erase operation on a selected block among the plurality of blocks, and
the erase operation includes an application end time for applying a first erase control voltage to the first group of the plurality of erase control lines that is different compared to an application end time for applying a second erase control voltage to the second group of the plurality of erase control lines.

8. The non-volatile memory device of claim 1, wherein according to a temperature of the non-volatile memory device, the non-volatile memory device is at least one of:
configured to control a compensation value with respect to a voltage level for applying a first erase control voltage to the first group of the plurality of erase control lines different from a compensation value with respect to a voltage level for applying a second erase control voltage to the second group of the plurality of erase control lines, or
configured to control a compensation value with respect to an application time for applying the first erase control voltage to the first group of the plurality of erase control lines different from a compensation value with respect to an application time for applying the second erase control voltage to the second group of the plurality of erase control lines.

9. The non-volatile memory device of claim 1, wherein the word line cut region of the plurality of word lines includes a first word line cut region, a second word line cut region, and a third word line cut region,
the plurality of erase control lines comprise a first erase control line, a second erase control line, a third erase control line, a fourth erase control line, a fifth erase control line, and a sixth erase control line,
the first erase control line, the second erase control line, and the third erase control line are between the first word line cut region and the second word line cut region in the first direction, and
the fourth erase control line, the fifth erase control line, and the sixth erase control line are between the second word line cut region and the third word line cut region in the first direction,
wherein the first erase control line, the third erase control line, the fourth erase control line, and the sixth erase control line are included in the first group of the plurality of erase control lines, and
the second erase control line and the fifth erase control line are included in the second group of the plurality of erase control lines.

10. The non-volatile memory device of claim 9, wherein the first pass transistor is commonly connected to the first erase control line, the third erase control line, the fourth erase control line, and the sixth erase control line,
the first pass transistor is configured to transmit a first erase control voltage to the first erase control line, the third erase control line, the fourth erase control line, and the sixth erase control line during an erase operation on a selected block among the plurality of blocks,
the second pass transistor is commonly connected to the second erase control line and the fifth erase control line,
the second pass transistor is configured to transmit a second erase control voltage to the second erase control line and the fifth erase control line during the erase operation on the selected block, and
at least one of a voltage level and an application time of the first erase control voltage is different from at least one of a voltage level and an application time of the second erase control voltage.

11. The non-volatile memory device of claim 1, wherein the word line cut region of the plurality of word lines include a first word line cut region, a second word line cut region, and a third word line cut region,
the plurality of erase control lines comprise a first erase control line, a second erase control line, a third erase control line, a fourth erase control line, a fifth erase control line, a sixth erase control line, a seventh erase control line, and an eighth erase control line,
the first erase control line, the second erase control line, the third erase control line, and the fourth erase control line are between the first word line cut region and the second word line cut region in the first direction,
the fifth erase control line, the sixth erase control line, the seventh erase control line, and the eighth erase control line are between the second word line cut region and a third word line cut region in the first direction,
the first erase control line, the fourth erase control line, the fifth erase control line, and the eighth erase control line are included in the first group of the plurality of erase control lines, and
the second erase control line, the third erase control line, the sixth erase control line, and the seventh erase control line are included in the second group of the plurality of erase control lines.

12. The non-volatile memory device of claim 11, wherein the first pass transistor is commonly connected to the first erase control line, the fourth erase control line, the fifth erase control line, and the eighth erase control line,
the first pass transistor is configured to transmit a first erase control voltage to the first erase control line, the fourth erase control line, the fifth erase control line, and the eighth erase control line during an erase operation on a selected block among the plurality of blocks,
the second pass transistor is commonly connected to the second erase control line, the third erase control line, the sixth erase control line, and the seventh erase control line,
the second pass transistor is configured to transmit a second erase control voltage to the second erase control line, the third erase control line, the sixth erase control line, and the seventh erase control line during the erase operation on the selected block, and
at least one of a voltage level and an application time of the first erase control voltage is different from at least one of a voltage level and an application time of the second erase control voltage.

13. The non-volatile memory device of claim 1, wherein the word line cut region of the plurality of word lines includes a first word line cut region, a second word line cut region, and a third word line cut region,
the plurality of erase control lines are grouped into the first group, the second group, and a third group,
the third group of the plurality of erase control lines is farther from the word line cut region than the second group of the plurality of erase control lines,
the plurality of erase control lines comprise a first erase control line, a second erase control line, a third erase control line, a fourth erase control line, a fifth erase control line, a sixth erase control line, a seventh erase control line, an eighth erase control line, a ninth erase control line, and a tenth erase control line, the first erase control line, the second erase control line, the third erase control line, the fourth erase control line, and the fifth erase control line are between the first word line cut region and the second word line cut region in the first direction, the sixth erase control line, the seventh erase control line, the eighth erase control line, the ninth erase control line, and the tenth erase control line are between the second word line cut region and the third word line cut region in the first direction, the first erase control line, the fifth erase control line, the sixth erase control line, and the tenth erase control line are included in the first group of the plurality of erase control lines, and the second erase control line, the fourth erase control line, the sixth erase control line, and the seventh erase control line are included in the second group of the plurality of erase control lines, and the third erase control line and the eighth erase control line are included in the third group of the plurality of erase control lines.

14. The non-volatile memory device of claim 13, wherein the pass transistor circuit further comprises a third pass transistor, the first pass transistor is commonly connected to the first erase control line, the fifth erase control line, the sixth erase control line, and the tenth erase control line, the first pass transistor is configured to transmit a first erase control voltage to the first erase control line, the fifth erase control line, the sixth erase control line, and the tenth erase control line during an erase operation on a selected block among the plurality of blocks, the second pass transistor is commonly connected to the second erase control line, the fourth erase control line, the sixth erase control line, and the seventh erase control line, the second pass transistor is configured to transmit a second erase control voltage to the second erase control line, the fourth erase control line, the sixth erase control line, and the seventh erase control line during the erase operation on the selected block, the third pass transistor is commonly connected to the third erase control line and the eighth erase control line, the third pass transistor is configured to transmit a third erase control voltage to the third erase control line and the eighth erase control line during the erase operation on the selected block, and the first erase control voltage, the second erase control voltage, and the third erase control voltage have least one of different voltage levels and different application times.

15. The non-volatile memory device of claim 1, further comprising:
a peripheral circuit region; and
a memory cell region, wherein
the plurality of word lines, the plurality of erase control lines, and the memory cell array are in the memory cell region of the non-volatile memory device,
the memory cell array includes a first metal pad,
the peripheral circuit region includes a second metal pad and is vertically connected to the memory cell region via the first metal pad and the second metal pad, and
the first metal pad and the second metal pad are connected to each other by bonding.

16. A non-volatile memory device comprising:
a memory cell array comprising a plurality of memory cells and a plurality of erase control transistors, wherein
the memory cell array includes a plurality of word lines,
the plurality of word lines include a word line cut region,
the plurality of erase control transistors are respectively connected to a plurality of erase control lines arranged on a same level,
the plurality of erase control lines are grouped into a plurality of groups,
the plurality of groups include a first group of the plurality of erase control lines including erase control lines that are relatively close to the word line cut region and a second group of the plurality of erase control lines including erase control lines that are relatively far from the word line cut region;
a pass transistor circuit comprising a first pass transistor connected to the first group of the plurality of erase control lines and a second pass transistor connected to the second group of the plurality of erase control lines; and
a control logic circuit configured to differently control, in response to an erase command, at least one of voltage levels and application times of a first erase control voltage applied to the first pass transistor and a second erase control voltage applied to the second pass transistor.

17. The non-volatile memory device of claim 16, wherein the plurality of erase control lines include a plurality of gate induced drain leakage (GIDL) gate lines, and
the plurality of erase control transistors include a plurality of GIDL select transistors connected to the plurality of GIDL gate lines.

18. The non-volatile memory device of claim 16, wherein the control logic circuit is configured to differently control voltage levels applied to the first pass transistor and the second pass transistor, respectively, such that a voltage level of the first erase control voltage is different from a voltage level of the second erase control voltage.

19. The non-volatile memory device of claim 16, wherein the control logic circuit is configured to differently control application times of the first erase control voltage and the second erase control voltage to the first group of the plurality of erase control lines and the second group of the plurality of erase control lines, respectively, such that an application start time of the first erase control voltage with respect to the first group of the plurality of erase control lines is different from an application start time of the second erase control voltage with respect to the second group the plurality of erase control lines.

20. A non-volatile memory device comprising:
a plurality of word lines stacked above a substrate in a vertical direction, the plurality of word lines including a word line cut region;
a plurality of string select lines above the plurality of word lines, the plurality of string select lines being spaced apart from each other in a first direction and extending in a second direction orthogonal to the first direction, respectively;
a plurality of erase control lines respectively arranged above the plurality of string select lines, wherein
the plurality of erase control lines are grouped into a plurality of groups, the plurality of groups include a first group of the plurality of erase control lines including erase control lines that are relatively close to a word line cut region and a second group of the plurality of erase control lines including erase control lines that are relatively far from the word line cut region;

a pass transistor circuit comprising a first pass transistor connected to the first group of the plurality of erase control lines and a second pass transistor connected to the second group of the plurality of erase control lines; and a memory cell array comprising a plurality of memory cells connected to the plurality of word lines, wherein the non-volatile memory device is configured to apply a first erase control voltage to the first group of the plurality of erase control lines via the first pass transistor and apply a second erase control voltage to the second group of the plurality of erase control lines via the second pass transistor, and a voltage level of the first erase control voltage is different from a voltage level of the second erase control voltage.

\* \* \* \* \*